United States Patent
Nolas

(10) Patent No.: US 6,369,314 B1
(45) Date of Patent: *Apr. 9, 2002

(54) SEMICONDUCTOR MATERIALS WITH PARTIALLY FILLED SKUTTERUDITE CRYSTAL LATTICE STRUCTURES OPTIMIZED FOR SELECTED THERMOELECTRIC PROPERTIES AND METHODS OF PREPARATION

(75) Inventor: George S. Nolas, Dallas, TX (US)

(73) Assignee: Marlow Industries, Inc., Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/654,532

(22) Filed: Sep. 1, 2000

Related U.S. Application Data

(63) Continuation-in-part of application No. 09/111,690, filed on Jul. 8, 1998, now Pat. No. 6,207,888.
(60) Provisional application No. 60/061,574, filed on Oct. 10, 1997.

(51) Int. Cl.[7] .............................................. H01L 35/34
(52) U.S. Cl. ....................... 136/201; 136/203; 136/205; 136/236.1
(58) Field of Search ................................ 136/203, 205, 136/236.1, 238, 239, 240

(56) References Cited

U.S. PATENT DOCUMENTS

| | | | |
|---|---|---|---|
| 5,006,505 A | 4/1991 | Skertic | 505/1 |
| 5,064,476 A | 11/1991 | Recine, Sr. | 136/201 |
| 5,171,372 A | 12/1992 | Recine, Sr. | 136/203 |
| 5,436,467 A | 7/1995 | Elsner et al. | 257/15 |
| 5,441,576 A | 8/1995 | Bierschenk et al. | 136/203 |
| 5,576,512 A | 11/1996 | Doke | 136/203 |
| 5,610,366 A | 3/1997 | Fleurial et al. | 136/202 |
| 5,747,728 A | 5/1998 | Fleurial et al. | 136/203 |
| 5,769,943 A | 6/1998 | Fleurial et al. | 117/219 |
| 5,994,639 A | 11/1999 | Johnson et al. | 136/236.1 |
| 6,169,245 B1 | 1/2001 | Sharp | 136/205 |
| 6,188,011 B1 | 2/2001 | Nolas et al. | 136/236.1 |

OTHER PUBLICATIONS

Gerald Mahan et al., "Thermoelectric Material: New Approaches to an Old Problem," *Physics Today*, Mar. 1997, pp. 42–47.

"Appendix 2: The Present State of Thermoelectrics Research in Skutterudites: NAS9–19358, Task 1.3" Marlow Industries, Inc., Feb. 28, 1997, pp. 25–44.

George S. Nolas et al., "New Materials for Thermoelectric Cooling Based on IrSb$_3$" 14th International Conference on Thermoelectrics, St. Petersburg, Jun. 1995, 4 pages.

(List continued on next page.)

Primary Examiner—Bruce F. Bell
Assistant Examiner—Thomas H. Parsons
(74) Attorney, Agent, or Firm—Baker Botts L.L.P.

(57) ABSTRACT

The present invention allows optimum filling of void spaces typically found in skutterudite type crystal lattice structures associated with various semiconductor materials. Selective filling provides semiconductor materials which are particularly beneficial for use in fabricating thermoelectric devices for electrical power generation and/or cooling applications. By selectively filling a portion of the void spaces associated with skutterudite type crystal lattice structure, reductions in thermal conductivity of the resulting semiconducting material may be optimized while concurrently minimizing any reduction in electrical properties of the resulting semiconductor materials, thus maximizing the thermoelectric figure of merit for the associated thermoelectric device. The present invention allows optimizing both the size and type of atoms and/or molecules used to fill void spaces in skutterudite type crystal lattice structure and to optimize the number of void spaces which are filled by such atoms and/or molecules.

24 Claims, 7 Drawing Sheets

OTHER PUBLICATIONS

Terry M. Tritt et al., "Low Temperature Transport Properties of IrSb$_3$," 14th International Conference on Thermoelectrics, St. Petersburg, Jun. 1995, 5 pages.

G. S. Nolas et al., "Raman scattering study of antimony–based skutterudites" *Journal of Applied Physics*, vol. 79, No. 5, Mar. 1, 1996, pp. 2622–2626.

Terry M. Tritt et al., "Low–temperature transport properties of the filled and unfilled IrSb$_3$ skutterudite system" *Journal of Applied Physics*, vol. 79, No. 11, Jun. 1, 1996, pp. 8412–8418.

G. S. Nolas et al, "The effect of rare–earth filling on the lattice thermal conductivity of skutterudites" *Journal of Applied Physics*, vol. 79, No. 8, Apr. 15, 1996, pp. 4002–4008.

G. S. Nolas et al, "Low–temperature transport properties of the mixed–valence semiconductor RU$_{0.5}$Pd$_{0.5}$Sb$_3$" *Journal of Applied Physics*, vol. 80, No. 11, Dec. 1, 1996, pp. 6304–6308.

T. Caillat et al., "Properties of single crystalline semiconducting CoSb$_3$" *Journal of Applied Physics*, vol. 80, No. 8, Oct. 15, 1996, pp. 4442–4449.

Th. Schmidt et al. "Structure Refinement of Skutterudite–Type Cobalt Triantimonide, CoSb$_3$" *Acta Cryst.*(1987). C43, pp. 1678–1679 No month available.

Marc D. Hornbostel et al., "Systematic Study of New Rare Earth Element—Iron–Anitmony Skutterudites Synthesized Using Multilayer Precursors" *Inorganic Chemistry*, vol. 36, No. 19, 1997, pp. 4270–4274 No month available.

Joseph Callaway et al., "Effect of Point Imperfections on Lattice Thermal Conductivity" *Physical Review*, vol. 120, No. 4, Nov. 15, 1960, pp. 1149–1154.

Joseph Callaway, "Model for Lattice Thermal Conductivity at Low Temperatures" *Physical Review*, vol. 113, No. 4, Feb. 15, 1959, pp. 1046–1051.

B. Abeles, "Lattice Thermal Conductivity of Disordered Semiconductor Alloys at High Temperatures" *Physical Review*, vol. 131, No. 5, Sep. 1, 1963.

R. D. Shannon et al., "Effective Ionic Radii on Oxides and Fluorides" *Acta Cryst.* (1969). B25, 925–46 No month available.

Glen A. Slack, "The Thermal Conductivity of Nonmetallic Crystals" *Solid State Physics*, vol. 34, 1979, pp. 1–70 No month available.

The Department of Defense FY 1997 Small Business Innovation Research (SBIR) Program, A97–11: "Novel Materials/Materials Structures Development for Thermoelectric Device Applications", p. 33 No month available.

U.S. Department of Energy, Advanced Energy Projects FY 1996 Research Summaries, "Off–Diagonal'Thermoelectricity for Cooling and Power Generation" by TecOne, pp. 30–31 Sep. 1996.

Singh, et al., "Properties of Novel Thermoelectrics From First Principles Calculations," Materials Research Society Symposium Procedures, vol. 545, pp. 3–11, presented Nov. 30–Dec. 4. 1998; published Spring 1999.

Sales, et al., "Filled Skutterudite Antimonides: A New Class of Thermoelectric Materials," Science, vol. 272, pp. 1325–1328, American Association for the Advancement of Science, May 31, 1996.

Fornari, et al., "Electronic structure and thermoelectric prospects of phosphide skutterudites," Physical Review B, vol. 59, No. 15, pp. 9722–9724, Apr. 15, 1999.

Fornari et al., "Prediction of room–temperature high–thermoelectric performance in n–type La(RU$_{1-x}$Rh$_x$)$_4$Sb$_{12}$," Applied Physics Letters, vol. 74, No. 24. pp. 3666–3668, Jun. 14, 1999.

SEMICONDUCTOR MATERIALS WITH PARTIALLY FILLED SKUTTERUDITE CRYSTAL LATTICE STRUCTURES OPTIMIZED FOR SELECTED THERMOELECTRIC PROPERTIES AND METHODS OF PREPARATION

CROSS-REFERENCES TO RELATED APPLICATIONS

This application is a continuation-in-part application based on application Ser. No. 09/111,690 filed Jul. 8, 1998 entitled Semiconductor Materials with Skutterudite Type Crystal Lattice Structures Optimized for Selected Thermoelectric Properties and Methods of Preparation, now U.S. Pat. No. 6,207,888 which claims the benefit of U.S. Provisional Patent Application Serial No. 60/061,574 filed Oct. 10, 1997.

BACKGROUND OF THE INVENTION

1. Field of the Invention

This invention relates to the design and preparation of semiconductor materials having skutterudite type crystal lattice structures with voids or cavities that may be selectively filled to enhance various thermoelectric properties of the semiconductor materials.

2. Description of the Related Art

The basic theory and operation of thermoelectric devices has been developed for many years. Presently available thermoelectric devices used for cooling typically include an array of thermocouples which operate in accordance with the Peltier effect. Thermoelectric devices may also be used for heating, power generation and temperature sensing.

Thermoelectric devices, for cooling applications, may be described as essentially small heat pumps which follow the laws of thermodynamics in the same manner as mechanical heat pumps, refrigerators, or any other apparatus used to transfer heat energy. A principal difference is that thermoelectric devices function with solid state electrical components (thermoelectric elements or thermocouples) as compared to more traditional mechanical/fluid heating and cooling components. The efficiency of a thermoelectric device is generally limited to its associated Carnot cycle efficiency reduced by a factor which is dependent upon the thermoelectric figure of merit (ZT) of materials used in fabrication of the associated thermoelectric elements. Materials used to fabricate other components such as electrical connections, hot plates and cold plates may also affect the overall efficiency of the resulting thermoelectric device.

The thermoelectric figure of merit (ZT) is a dimensionless measure of the effectiveness of a thermoelectric device and is related to material properties by the following equation:

$$ZT = S^2 \sigma T / \kappa \quad (1)$$

where S, $\sigma$, $\kappa$, and T are the Seebeck coefficient, electrical conductivity, thermal conductivity and absolute temperature, respectively. The Seebeck coefficient (S) is a measure of how readily the respective charge carriers (electrons or holes) can transfer energy as they move through a thermoelectric element which is subjected to a temperature gradient. The type of carrier (electron or hole) is a function of the dopants in the semiconductor materials selected to form each thermoelectric element.

The electrical properties (sometimes referred to as power factor, electrical characteristics, electronic properties, or electronic characteristics) associated with materials used to form thermoelectric elements may be represented by $S^2\sigma$. Many of the materials which are used to form thermoelectric elements may be generally described as semiconductor compounds or semiconductor materials. Examples of such materials will be discussed later in more detail.

The thermoelectric figure of merit (ZT) is also related to the strength of interactions between the carriers and vibrational modes of the crystal lattice structure (phonons) and available carrier energy states. Both the crystal lattice structure and the carrier energy states are a function of the materials selected to form each thermoelectric device. As a result, thermal conductivity ($\kappa$) is a function of both an electronic component ($\kappa_e$) primarily associated with the respective carriers and a lattice component ($\kappa_g$) primarily associated with the respective crystal lattice structure and propagation of phonons through the respective crystal lattice structure. In the most general sense, thermal conductivity may be stated by the equation:

$$\kappa = \kappa_e + \kappa_g \quad (2)$$

The thermoelectric figure of merit (ZT) may also be stated by the equation:

$$ZT = \frac{S^2 T}{\rho \kappa} \quad (3)$$

$\rho$=electrical resistivity
$\sigma$=electrical conductivity $$\text{electrical conductivity} = \frac{1}{\text{electrical resistivity}} \quad \text{or} \quad \sigma = \frac{1}{\rho}$$

Thermoelectric materials for cooling and power generation applications such as alloys of $Bi_2Te_3$, PbTe and BiSb were developed thirty to forty years ago. More recently, semiconductor alloys such as SiGe have been used in the fabrication of thermoelectric power generation devices. Commercially available thermoelectric materials are generally limited to use in a temperature range between 200° K and 1300° K with a maximum ZT value of approximately one. The efficiency of such thermoelectric devices remains relatively low at approximately five to eight percent (5–8%) energy conversion efficiency. For the temperature range of −100° C. to 1000° C., maximum ZT for many state of the art thermoelectric materials also remains limited to values of approximately 1, except for Te—Ag—Ge—Sb alloys (TAGS) which may achieve a ZT of 1.2 to 1.4 in a relatively narrow temperature range. Recently developed materials such as $Si_{80}Ge_{20}$ alloys used in thermoelectric generators to power spacecrafts for deep space missions have an average thermoelectric figure of merit (ZT) of approximately equal to 0.5 from 300° C. to 1,000° C.

Many crystalline materials with low thermal conductivity do not have good electrical conductivity and many crystalline materials with good electrical conductivity often have relatively high values of thermal conductivity. For example, many binary semiconductor compounds which have skutterudite type crystal lattice structures have relatively good electrical properties. However, the value of thermal conductivity associated with the skutterudite type crystal lattice structure of such semiconductor compounds is generally relatively large which often results in a thermoelectric figure of merit (ZT) which is less than desired.

Research and development has previously been conducted on fabricating thermoelectric devices with thermoelectric elements formed from materials having skutterudite type crystal lattice structures. Examples of such developments are shown in U.S. Pat. No. 5,610,366 entitled High Performance Thermoelectric Materials and Methods of Preparation issued Mar. 11, 1997. Patent application Ser. No. 08/101,901 filed Aug. 3, 1993, entitled A Semiconductor Apparatus Utilizing Gradient Freeze and Liquid-Solid Techniques, now U.S. Pat. No. 5,769,943, and patent application Ser. No. 08/412,700 filed Mar. 29, 1995, entitled Advanced Thermoelectric Materials with Enhanced Crystal Lattice Structure and Methods of Preparation, now U.S. Pat. No. 5,747,728, show additional examples of skutterudite type crystal lattice structures which may be used to fabricate thermoelectric devices.

One reference presents X-ray analysis of synthesized samples with the major phase being partially filled phosphorous based skutterudite type crystal lattice structures. See, "Synthesis and Crystal Structure of a New Series of Ternary Phosphides in the System TR-Co-P (TR: Rare Earth)" by S. Zemni, D. Tranqui, P. Chaudouet, R. Madar, and J. P. Senateur, *Journal Solid State Chemistry*, 65, 1 (1986).

SUMMARY OF THE INVENTION

In accordance with teachings of the present invention, the design and preparation of semiconductor materials used in fabrication of thermoelectric devices have been substantially improved to provide significantly enhanced operating efficiencies. The present invention provides the ability to obtain increased efficiency from a thermoelectric device having one or more thermoelectric elements fabricated from materials with skutterudite type crystal lattice structures modified in accordance with the teachings of the present invention to optimize selected thermoelectric characteristics of the resulting thermoelectric device. A significant reduction in thermal conductivity ($\kappa$) may be achieved by filling a portion of the voids associated with skutterudite type crystal lattice structures as compared to materials having skutterudite type crystal lattice structures with either essentially no filling of the associated voids or approximately one hundred percent (100%) filling of the associated voids. By selecting atoms and/or molecules in accordance with teachings of the present invention to fill a portion of such void spaces, phonon propagation through the resulting skutterudite type crystal lattice structure may be significantly affected to reduced thermal conductivity ($\kappa$) while at the same time minimizing any reduction in electrical properties ($S^2\sigma$) of the associated materials. Examples of semiconductor materials and compounds which may be satisfactory for use with the present invention include, but are not limited to, $CoP_3$, $CoAs_3$, $CoSb_3$, $RhP_3$, $RhAs_3$, $RhSb_3$, $IrP_3$, $IrAs_3$ and $IrSb_3$ and alloys of these compounds.

In accordance with one aspect of the present invention, a selected portion of the voids or cavities typically associated with a skutterudite type crystal lattice structure may be filled to optimize the reduction in thermal conductivity ($\kappa$) of the associated semiconductor material while at the same time minimizing any reduction in electrical properties which results in maximizing the thermoelectric figure of merit (ZT) for the resulting thermoelectric device. Semiconductor materials having a skutterudite crystal lattice structure with a portion of the associated voids filled in accordance with teachings of the present invention have demonstrated an order of magnitude decrease in thermal conductivity ($\kappa$) measured at room temperature and a much larger decrease at lower temperatures. Thermoelectric devices with thermoelectric elements fabricated from materials with skutterudite type crystal lattice structures partially filled in accordance with teachings of the present invention may have substantially enhanced thermoelectric operating characteristics and improved efficiencies as compared to previous thermoelectric devices.

In accordance with another aspect of the present invention, both N-type and P-type semiconductor materials with skutterudite type crystal lattice structures may have a portion of their associated void spaces filled. Thermoelectric elements fabricated from such semiconductor materials may be used for manufacturing thermoelectric devices with substantially enhanced operating characteristics and improved efficiencies as compared to previous thermoelectric devices.

Technical advantages of the present invention include the use of semiconductor materials having skutterudite type crystal lattice structures in which a portion of the voids associated with such crystal structures have been filled with atoms and/or molecules selected in accordance with teachings of the present invention. Fabricating a thermoelectric device from such semiconductor materials may substantially enhance the associated operating efficiency. Such thermoelectric devices may be used for cooling, heating, electrical power generation and temperature sensing.

Various embodiments of the present invention have been reduced to practice and selected tests have been performed to prove the principles and concepts associated with the present invention. The "disorder" resulting from atoms, selected in accordance with teachings of the present invention, to fill voids or cavities in skutterudite type crystal lattice structures associated with various semiconductor compounds have a substantial influence on reducing thermal conductivity ($\kappa$) of the resulting lattice structure. Filling only a portion of the voids or cavities in accordance with teachings of the present invention may result in less scattering of the carriers when subjected to both a temperature gradient and a difference in DC voltage as compared to skutterudite type crystal lattice structures with approximately one hundred percent (100%) filling of such voids or cavities. Some of these embodiments and selected test results will be discussed later in more detail.

Depending upon the desired thermoelectric device, various semiconductor materials may be formed in accordance with the teachings of the present invention include, but are not limited to, the following described general formulas. One variation of the present invention may be used to form a semiconductor compound with the general formula $$X^1_4 B^1_y A^2_{3x} X^2_{12-3x}$$

with y selected to be in the range of greater than zero and less than one to fill the selected portions of normally void subcells to optimize the thermoelectric figure of merit. Another variation of the present invention is a semiconductor compound having a partially filled skutterudite type crystal lattice structure with the general formula:

$$D_y E_x X^1_{4-x} X^2_{12}$$

with D selected from the group consisting of La, Ce, Pr, Sm, Eu, Gd, Tb, Dy, Ho, Er, Tm, Yb, Lu, K, Th, Pa, U, Sn, Pb, Bi, Br and I; E selected from the group consisting of Co, Rh and Ir; $X^1$ selected from the group consisting of Ni, Pd, Ru, Os, Pt and Fe; $X^2$ selected from the group consisting of Sb, P, As, Bi, Sn, In, Ga, Ge, Si or a combination thereof; and, y selected to be in the range of greater than zero and less than one to fill the selected portion of normally void subcells to optimize the thermoelectric figure of merit. Another embodiment of the present invention includes the following variation to form a semiconductor compound having the general formula:

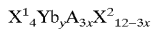

with a generally stoichiometric ratio of elements $X^1$ and $X^2$ which normally form a binary semiconductor compound having the skutterudite crystal lattice structure; A selected from the group consisting of Bi, Sn, In, Ga, Ge, and Si; and y selected to be in the range of greater than zero and less than one to fill the portion of normally void subcells to optimize the thermoelectric figure of merit. Lastly, the present invention may utilize the following variation to form a semiconductor compound having the general formula:

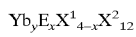

with E selected from the group consisting of Co, Rh and Ir; $X^1$ selected from the group consisting of Sn, Ge, In, Ga and Si; $X^2$ selected from the group consisting of Sb, P, As, Bi, Sn, In, Ga, Ge and Si, or a combination thereof; and y selected to be in the range of greater than zero and less than one to fill the selected portion of normally void subcells to optimize the thermoelectric figure of merit.

BRIEF DESCRIPTION OF THE DRAWINGS

For a more complete understanding of the present invention and its advantages, reference is now made to the following description taken in conjunction with the accompanying drawings in which.

DETAILED DESCRIPTION OF THE INVENTION

The preferred embodiments of the present invention and its advantages are best understood by reference to FIGS. 1 through 14 of the drawings, like numerals being used for like and corresponding parts in the various drawings.

Figure 1:
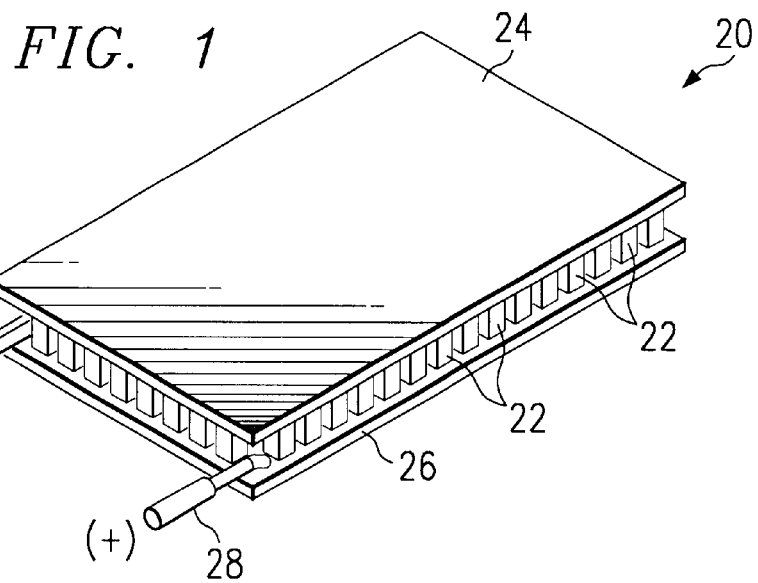
FIG. 1 is a schematic drawing showing an isometric view of a thermoelectric device having multiple thermoelectric elements which may be fabricated from materials having skutterudite type crystal lattice structures incorporating teachings of the present invention.
Figure 2:
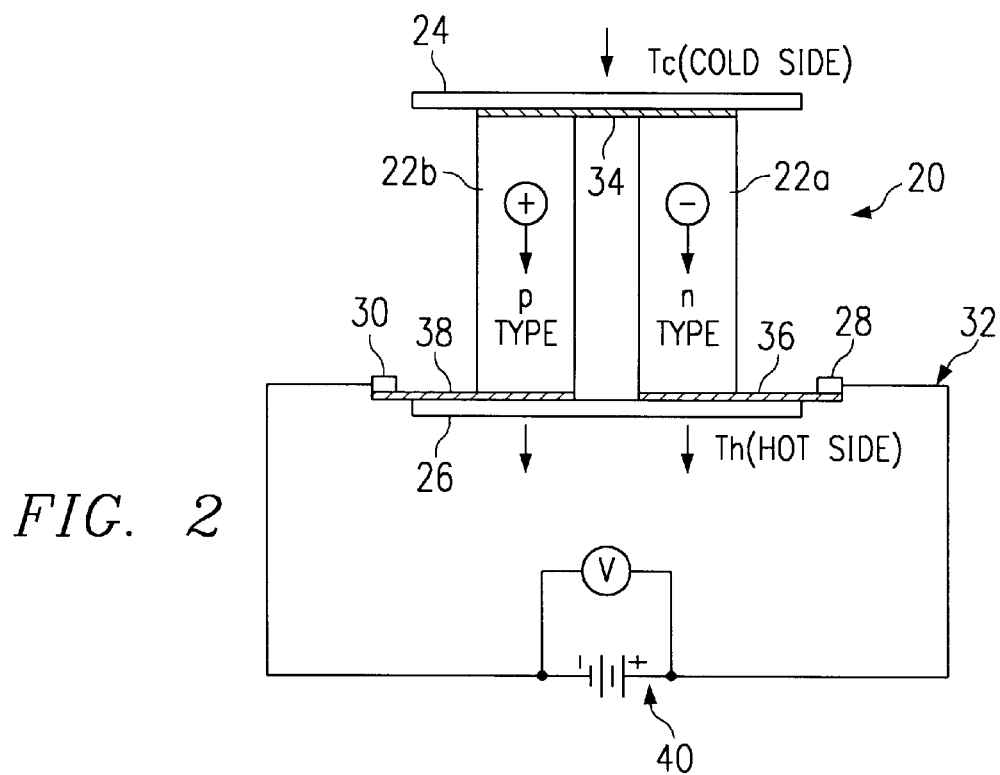
FIG. 2 is an electrical schematic drawing of one thermocouple of the thermoelectric device of FIG. 1.

Thermoelectric device 20, as shown in FIGS. 1 and 2, may be manufactured from materials having skutterudite type crystal lattice structures fabricated in accordance with teachings of the present invention. Selective filling in accordance with teachings of the present invention of normally void subcells or cubes formed in such skutterudite type crystal lattice structures allows optimization of various desired thermoelectric characteristics depending upon the intended use of the resulting thermoelectric device 20.

Thermoelectric device 20 may be used as a heater, cooler, electrical power generator and/or temperature sensor. The thermoelectric figure of merit (ZT) of thermoelectric device 20 will vary depending upon the type of use. For example, thermoelectric device 20 may have a first value of ZT when used as a cooler and a second, different value of ZT when used as an electrical power generator. One of the technical benefits of the present invention includes selectively filling void subcells or cubes of a skutterudite type crystal lattice structure to optimize performance of thermoelectric device 20 depending upon its intended use.

Thermoelectric device 20 is preferably manufactured with a plurality of thermoelectric elements (sometimes referred to as "thermocouples") 22 between cold plate 24 and hot plate 26. Electrical connections 28 and 30 are provided to allow attaching thermoelectric device 20 to an appropriate source of DC electrical power. If thermoelectric device 20 were designed to function as an electrical power generator, electrical connections 28 and 30 would represent the output terminals from such a power generator operating between hot and cold temperature sources (not expressly shown).

FIG. 2 is a schematic representation of electrical circuit 32 which is typical for a single stage thermoelectric device such as thermoelectric device 20. Electrical circuit 32 is also typical of electrical circuits associated with using thermoelectric elements or thermocouples to convert heat energy into electrical energy. Electric circuit 32 generally includes two or more thermoelectric elements 22 fabricated from dissimilar semiconductor materials such as N-type thermoelectric element 22a and P-type thermoelectric elements 22b. Thermoelectric elements 22 are typically arranged in an alternating N-type element to P-type element configuration. In many thermoelectric devices, semiconductor materials with dissimilar characteristics are connected electrically in series and thermally in parallel.

Examples of thermoelectric devices and methods of fabrication are shown in U.S. Pat. No. 5,064,476 entitled Thermoelectric Cooler and Fabrication Method; U.S. Pat. No. 5,171,372 entitled Thermoelectric Cooler and Fabrication Method; U.S. Pat. No. 5,441,576 entitled Thermoelectric Cooler; and U.S. Pat. No. 5,576,512 entitled Thermoelectric Apparatus for Use With Multiple Power Sources and Method of Operation.

N-type semiconductor materials generally have more electrons than necessary to complete atomic bonding of the associated crystal lattice structure. P-type semiconductor materials generally have fewer electrons than necessary to complete atomic bonding of the associated crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers which transport or move heat energy between the cold side or cold plate 24 and hot side or hot plate 26 through thermoelectric elements 22 when subject to a DC voltage potential. These same agents or carriers may generate electrical power when an appropriate temperature difference is present between cold side 24 and hot side 26.

Materials having a skutterudite type crystal lattice structure will generally function as semiconductors when the donated electron count per cubic unit cell is approximately equal to 144.0 which is the number of electrons required for the desired bonding. To provide N-type semiconductors, materials with skutterudite type crystal lattice structures are often preferentially doped such that there are excess electrons, as compared to 144.0. To provide P-type semiconductors, materials with skutterudite type crystal lattice structures are typically preferentially doped such that there are less electrons, as compared to 144.0.

Vibrational modes of the associated crystal lattice structure (sometimes referred to as "phonons") may also cooperate with the carriers to transport or move heat energy through thermoelectric elements 22. As discussed later in more detail the phonons may adversely effect some of the electrical properties associated with the respective carriers. Ceramic materials are frequently used to manufacture plates 24 and 26 which define in part the cold side and hot side, respectively, of thermoelectric device 20.

In thermoelectric device 20, alternating thermoelectric elements 22a and 22b of N-type and P-type semiconductor materials may have their ends connected in a serpentine fashion by electrical conductors such as 34, 36 and 38. Conductors 34, 36 and 38 are typically metallizations formed on the interior surfaces of ceramic plates 24 and 26. Presently available thermoelectric devices which function as a cooler generally include two ceramic plates with P-type and N-type elements formed from bismuth telluride ($Bi_2Te_3$) alloys disposed between the ceramic plates and electrically connected with each other.

When DC electrical power from power supply 40 is properly applied to thermoelectric device 20 heat energy will be absorbed on cold side 24 of thermoelectric device 20. The heat energy will pass through thermoelectric elements 22 and will be dissipated on hot side 26 of thermoelectric device 20. A heat sink (sometimes referred to as a "hot sink", not shown) may be attached to hot plate 26 of thermoelectric device 20 to aid in dissipating heat transferred by the associated carriers through thermoelectric elements 22 to the adjacent environment. In a similar manner, a heat sink (sometimes referred to as a "cold sink", not shown) may be attached to cold side 24 of thermoelectric device 20 to aid in removing heat from the adjacent environment. Thus, thermoelectric device 20 may sometimes function as a thermoelectric cooler when properly connected with power supply 40. However, since thermoelectric devices are a type of heat pump, thermoelectric device 20 may also function as a heater, power generator, or temperature sensor.

Figure 3A:
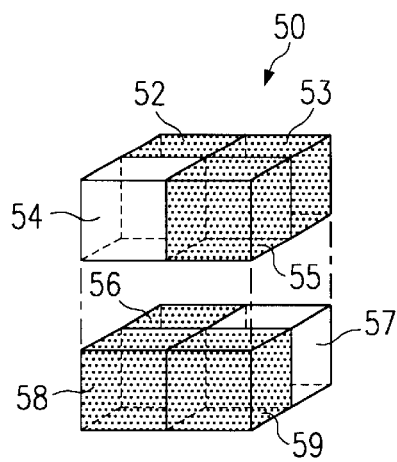
FIG. 3A is an exploded isometric drawing showing a schematic representation of a unit cell for a typical skutterudite type crystal lattice structure with two void subcells or cubes which may be filled in accordance with teachings of the present invention.
Figure 3B:
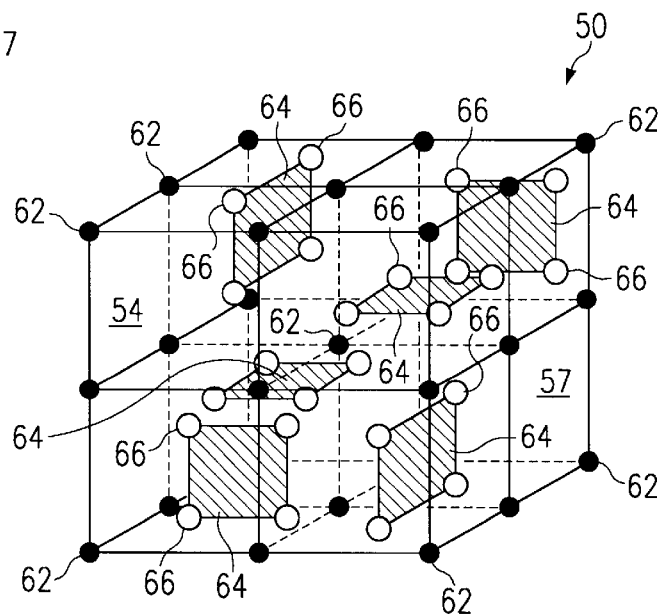
FIG. 3B is an isometric drawing showing a more detailed schematic representation of the unit cell of FIG. 3A for a typical binary semiconductor compound, including atomic crystallographic sites which define in part the skutterudite type crystal lattice structure and the associated two void subcells or cubes.

Various semiconductor materials (sometimes referred to as "semiconductor compounds") such as $CoP_3$, $CoAs_3$, $CoSb_3$, $RhP_3$, $RhAs_3$, $RhSb_3$, $IrP_3$, $IrAs_3$, $IrSb_3$ and alloys of these compounds may be prepared in accordance with teachings of the present invention to form dense polycrystalline materials with a skutterudite type crystal lattice structure as represented by unit cell 50 shown in FIGS. 3A and 3B.

Semiconductor compounds such as $CoP_3$, $CoAs_3$, $CoSb_3$, $RhP_3$, $RhAs_3$, $RhSb_3$, $IrP_3$, $IrAs_3$ and $IrSb_3$ may sometimes be referred to as "binary semiconductor compounds." A typical alloy of such binary semiconductor compounds may be represented by the formula $Ir_xCo_{1-x}Sb_3$ where the value of x may vary from 0 to 1. For this specific example, one atom of iridium (Ir) will replace one atom of cobalt (Co) at a corresponding atomic crystallographic site in the associated skutterudite type crystal lattice structure. However, semiconductor materials represented by $CoSb_3$ and semiconductor compounds represented by $Ir_xCo_{1-x}Sb_3$ have essentially the same skutterudite type crystal lattice structure. Therefore, the following detailed description of the present invention applies both to binary semiconductor compounds having skutterudite type crystal lattice structures and alloys of such binary semiconductor compounds.

FIG. 3A is an exploded schematic drawing of a typical skutterudite type crystal lattice structure defined in part by unit cell 50 having eight subcells or cubes 52, 53, 54, 55, 56, 57, 58, and 59. Subcells 52, 53, 55, 56, 58, and 59 are shown with dots to indicate that these subcells have been "filled." Subcells 54 and 57 are shown as open or "unfilled." Subcells or cubes 54 and 57 represent void spaces or cavities in the skutterudite type crystal lattice structure represented by unit cell 50. Filling only a portion of normally open or void subcells 54 and 57 in accordance with teachings of the present invention will be discussed later in more detail.

A skutterudite type crystal lattice structure as represented by unit cell 50 includes a generally cubic lattice formed in part by metal atoms 62. More specifically as shown in FIG. 3B, unit cell 50 is defined by thirty-two atomic crystallographic sites where eight positions may be occupied by metal atoms 62 and twenty-four positions may be occupied by semi-metal and/or nonmetal atoms 66.

Metal atoms 62 may be selected from the group consisting of ruthenium, rhenium, palladium, iron, platinum, osmium, nickel, cobalt, iridium, and/or rhodium. Metal atoms 62 cooperate with each other to further define subcells or cubes 52–59 of unit cell 50. The dimension of unit cell 50 for skutterudite type crystal lattice structures typically ranges from 7.7 to 9.4 angstroms (Å). Some polycrystalline semiconductor materials may form skutterudite type crystal lattice structures with larger or smaller unit cell dimensions.

Skutterudite type crystal lattice structures as represented by unit cell 50 generally include six planar rings 64. Each planar ring 64 is in turn defined by four non-metal and/or semimetal atoms 66. Each metal atom 62 typically has six neighboring semimetal or non-metal atoms 66. Non-metal and/or semi-metal atoms 66 each have two adjacent non-metal atoms 66 and two adjacent metal atoms 62. For some applications, atoms 66 may be members of the nitrogen family of elements, Group V in the periodic table, which may also be referred to as pnictides.

Since skutterudite type crystal lattice structures as represented by unit cell 50 generally have only six planar rings 64, two of the subcells or cubes associated with each unit cell 50 will be normally empty. For purposes of illustration, unit cell 50 is shown in FIGS. 3A and 3B with subcells or cubes 52, 53, 55, 56, 58 and 59 filled with a respective planar ring 64. The dimensions of each planar ring 64 are generally larger than the associated subcells 52, 53, 55, 56, 58 and 59. As a result, planar rings 64 may actually extend beyond the sides of their respective subcells 52, 53, 55, 56, 58 and 59. Subcells or cubes 54 and 57 are unfilled or empty and constitute cavities or voids within unit cell 50. The center of each normally void subcell or cube 54 and 57 is coordinated by twelve non-metal and/or semimetal atoms 66 since planar rings 64 generally extend beyond their respective subcells 52, 53, 55, 56, 58 and 59. For example, when $La^{+3}$ ions are used to fill a selected number of normally void subcells 54 and/or 57 in $CoSb_4$, each $La^{+3}$ ion will be surrounded by twelve Sb atoms in adjacent planar rings 64.

For semiconductor materials which have skutterudite type crystal lattice structures, normally void subcells or cubes 54 and 57 are large enough to hold one or possibly more atoms (ions) or molecules selected in accordance with teachings of the present invention. Table I is a listing of nine binary semiconducting compounds which typically have skutterudite type crystal lattice structures as represented by unit cell 50 shown in FIGS. 3A and 3B. The respective lattice parameters ($a_0$) are taken from available crystallographic data. The radii (r) of each normally void subcell or cube 54 and 57 has been calculated using crystallographic data.

Lattice parameter ($a_0$) and radii (r) of normally void subcells 54 and 57 are expressed in angstroms (Å).

TABLE I

| $CoP_3$ | $CoAs_3$ | $CoSb_3$ |
|---|---|---|
| $a_o = 7.7073$ | $a_o = 8.205$ | $a_o = 9.0385$ |
| $r = 1.763$ | $r = 1.825$ | $r = 1.892$ |
| $RhP_3$ | $RhAs_3$ | $RhSb_3$ |
| $a_o = 7.9951$ | $a_o = 8.4507$ | $a_o = 9.2322$ |
| $r = 1.909$ | $r = 1.934$ | $r = 2.024$ |
| $IrP_3$ | $IrAs_3$ | $IrSb_3$ |
| $a_o = 8.0151$ | $a_o = 8.4673$ | $a_o = 9.2503$ |
| $r = 1.906$ | $r = 1.931$ | $r = 2.040$ |

Semiconductor materials having skutterudite type crystal lattice structures may be doped with selected impurities to produce N-type thermoelectric elements 22a and P-type thermoelectric elements 22b. For example, adding platinum (Pt) as a doping agent to many semiconductor materials including those listed on Table I will typically produce N-type thermoelectric elements 22a. If desired, thermoelectric device 20 may be manufactured with N-type thermoelectric elements 22a fabricated from semiconductor materials including those listed on Table I with a selected portion of normally void subcells 54 and 57 filled in accordance with teachings of the present invention and P-type thermoelectric elements 22b fabricated from previously available semiconductor materials such as alloys of Bi, S, Se, As, Sb, Te, or salts of lead with chalcogen elements.

Some semiconductor materials including several of the compounds listed in Table I may be doped with elements such as tin (Sn) or germanium (Ge) to produce P-type thermoelectric elements 22b. Other semiconductor materials with skutterudite type crystal lattice structures may be satisfactorily doped with elements such as iron (Fe), nickel (Ni) and/or platinum (Pt).

Thermoelectric device 20 may be manufactured with P-type thermoelectric elements 22b fabricated for example from semiconductor compounds represented by formulas such as $Co_4La_yA_{3x}Sb_{12-3x}$, $Ir_4La_yA_{3x}Sb_{12-3x}$, or $Ir_4Nd_yA_{3x}Sb_{12-3x}$ where A may be Ge, Sn, In or Ga for example. For other applications, N-type thermoelectric elements 22a may be fabricated from semiconductor compounds represented by $Co_4E_yA_{3x}Sb_{12-3x}$ where, A may be selected from the group consisting of group IV elements, such as Sn, group III elements, such as In or group II elements, such as cadmium (Cd). E may be selected from the group consisting of group I elements, such as Na, group II elements, such as barium (Ba), lanthanides, such as La, Ce or Ytterbium (Yb), actinides, such as thorium (Th), or a combination thereof. The term "lanthanide" and "lanthanides" refer to rare earth elements with atomic numbers 58 through 71. The doping concentration of A, signified by x, may be zero or non-zero and is normally varied in order to obtain optimum thermoelectric properties.

N-type thermoelectric elements 22a may be fabricated from previously available semiconductor materials such as alloys of Bi, S, Se, As, Sb, Te or salts of lead with chalcogen elements. Thermoelectric device 20 may also be manufactured with P-type thermoelectric elements 22b fabricated for example from semiconductor compounds represented by the general formula $E_yCo_{4-x}D_xSb_{12}$ where D may be selected from the groups consisting of ruthenium (Ru), iron (Fe) or osmium (Os).

Figure 4:
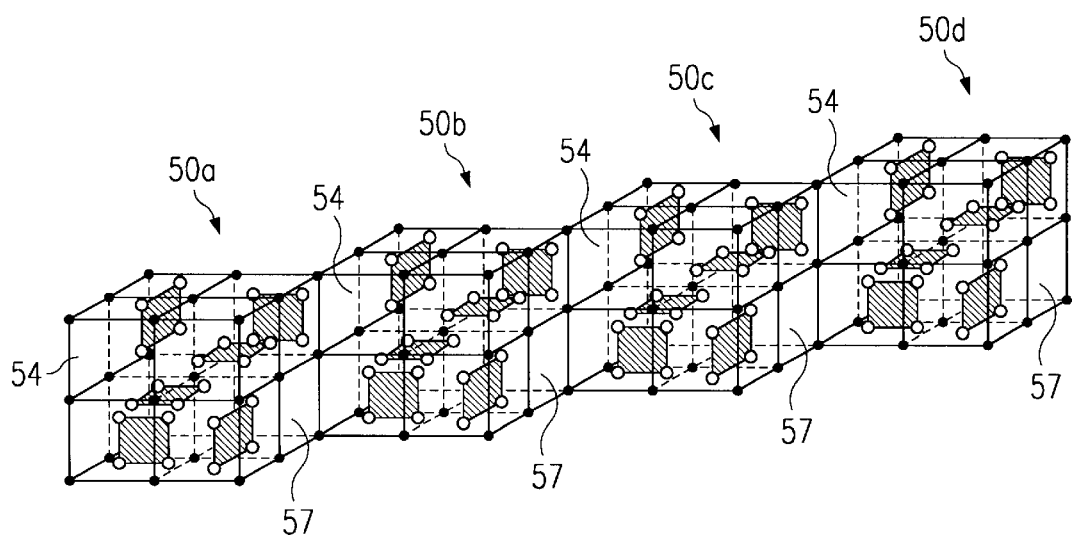
FIG. 4 is an isometric drawing showing a schematic representation of four unit cells with skutterudite type crystal lattice structures and the respective void subcells or cubes of each unit cell periodically ordered whereby selective filling of such void subcells or cubes in accordance with teachings of the present invention may enhance desired thermoelectric characteristics as compared with essentially no filling or approximately one hundred percent (100%) filling of such normally void subcells or cubes.

FIG. 4 shows four unit cells 50a, 50b, 50c and 50d of a typical skutterudite type crystal lattice structure. Unit cells 50a, 50b, 50c and 50d may represent a portion of a large single crystal of a semiconductor material, or multiple crystals of a polycrystalline semiconductor material.

Covalent bonding associated with skutterudite type crystal lattice structures generally provides relatively high carrier mobility which results in a relatively large value of electrical conductivity which tends to increase the thermoelectric figure of merit (ZT) for the associated semiconductor material. However, many semiconductor materials which have skutterudite type crystal lattice structures as represented by unit cell 50 with essentially no filling of normally void subcells 54 and 57 often have a relatively high value of thermal conductivity which limits the thermoelectric figure of merit (ZT) for the associated semiconductor materials to a value of much less than one. Various techniques have been previously used to fill essentially all of the normally void subcells or cubes 54 and 57 in adjacent units cells 50a, 50b, 50c and 50d. Filling essentially all void subcells or cubes 54 and 57 results in a reduction of thermal conductivity but also limits the mobility of the carriers associated with the respective semiconductor material.

As previously noted, thermal conductivity ($\kappa$) is a function of both an electrical component ($\kappa_e$) primarily associated with the respective carriers and a lattice component ($\kappa_g$) primarily associated with the respective crystal lattice structure and propagation of phonons through the crystal lattice structure. Generally, increasing atomic disorder within a crystal lattice structure will reduce the phonon propagation distance resulting in the reduction of the lattice component of the thermal conductivity ($\kappa_g$) towards its absolute minimum value (represented by $\kappa_{min}$). However, carrier mobility is generally much higher in a perfectly ordered atomic structure with covalent bonds that substantially reduce or eliminate any scattering of the associated carriers as each carrier propagates through the respective crystal lattice structure. As discussed later in more detail, skutterudite type crystal lattice structures as represented by unit cell 50 allow substantial reductions in thermal conductivity ($\kappa$) while at the same time minimizing any detrimental effects on carrier mobility or other electrical properties associated with the semiconductor materials forming the skutterudite type crystal lattice structure. The value of such electrical properties may be represented as $S^2\sigma$.

Figure 5:
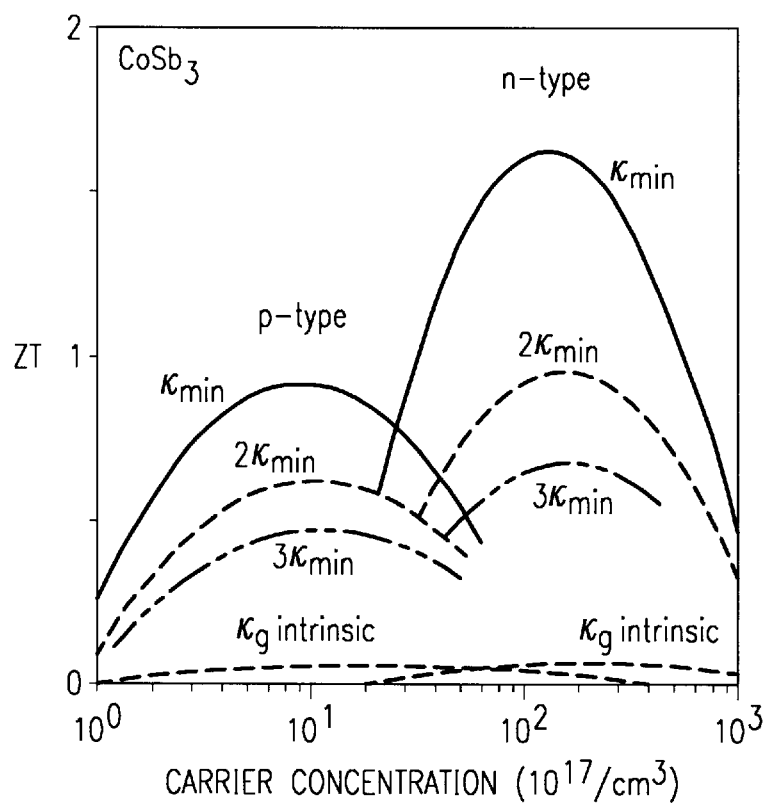
FIG. 5 is a graphical representation of the thermoelectric figure of merit (ZT) versus carrier concentration of P-type and N-type $CoSb_3$ at room temperatures for different values of thermal conductivity ($\kappa$)

FIG. 5 is a graphical representation of thermoelectric figure of merit (ZT) versus carrier concentration for P-type and N-type semiconductor compounds of $CoSb_3$ at room temperature. $CoSb_3$ may sometimes be referred to as a binary semiconductor compound. The anticipated values of ZT were calculated from experimental data on samples of $CoSb_3$ with various carrier concentrations and for different values of the lattice component of thermal conductivity ($\kappa_g$). The calculations represented by the various curves for $\kappa_g$ as shown in FIG. 5 clearly indicate that semiconductor materials with a value of $\kappa_g$ close to $\kappa_{min}$ is preferable for use in fabricating thermoelectric elements 22 to provide thermoelectric device 20 with an enhanced value of thermoelectric figure of merit (ZT). $\kappa_{min}$ is approximately equal to 3.1 mW/cmK for $CoSb_3$.

The plot of intrinsic $\kappa_g$ assumes only phonon-phonon scattering in the associated binary skutterudite type crystal lattice structure. The information shown in FIG. 5 indicates that the thermoelectric performance of semiconductor compounds such as $CoSb_3$ which have skutterudite type crystal lattice structure depends substantially on the value of the lattice component of thermal conductivity ($\kappa_g$).

Figure 6:
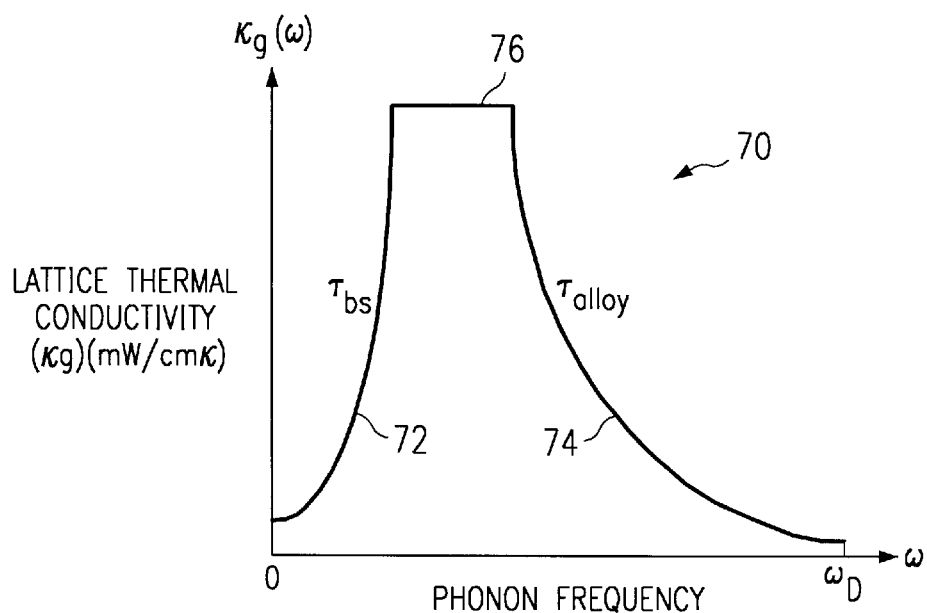
FIG. 6 is a schematic representation of the lattice component of thermal conductivity ($\kappa_g$) versus phonon frequency ($\omega$)

Various techniques have previously been used in an attempt to reduce the lattice component of thermal conductivity ($\kappa_g$) in semiconductor compounds including those with skutterudite type crystal lattice structures. Alloying and grain boundary scattering in the associated crystal lattice structure represent some of the different mechanisms for increasing phonon scattering. However, many of the previously used phonon-scattering techniques have typically been effective in only a particular phonon energy range while interacting relatively weakly with phonons outside the limited energy range. Line 70 shown in FIG. 6 is a graphical representation of this effect.

Portion 72 of the line 70 represents a decrease in the lattice component of thermal conductivity ($\kappa_g$) associated with grain boundary scattering at relatively low phonon frequencies. Portion 74 of the line 70 represents a decrease in the lattice component of thermal conductivity ($\kappa_g$) due to alloy scattering at relatively high phonon frequencies. However, portion 76 of the line 70 shown in FIG. 6 indicates that a substantial portion of the phonon frequency range has not been effected by either grain boundary scattering or alloy scattering.

Figure 7:
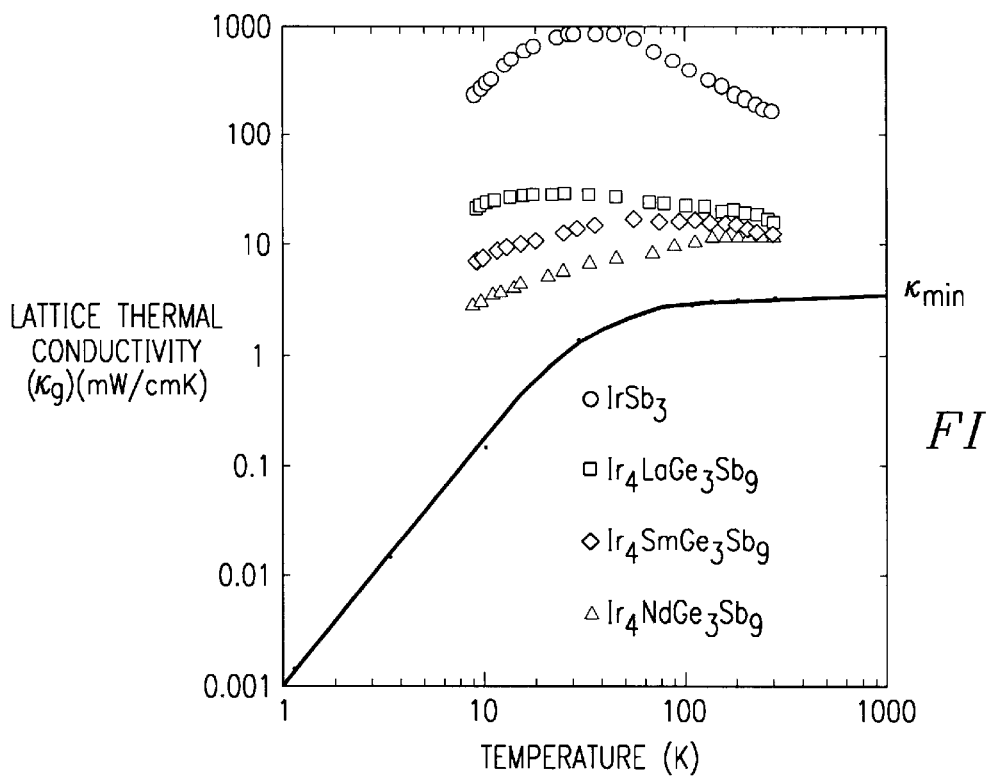
FIG. 7 is a graphical representation of the lattice component of thermal conductivity ($\kappa_g$) versus absolute temperature for semiconductor compounds of $IrSb_3$ and $Ir_4Ge_3Sb_9$ with the respective skutterudite type crystal lattice structures having normally void subcells or cubes selectively filled with $La^{+3}$, $Nd^{+3}$, and $Sm^{+3}$ ions in accordance with teachings of the present invention.

FIG. 7 is a graphical representation of the lattice component of thermal conductivity versus temperature for $La^{+3}$, $Nd^{+3}$ and $Sm^{+3}$ ion filled skutterudite type crystal lattice structures, $IrSb_3$ and $\kappa_{min}$ of $IrSb_3$. The calculated values of the minimum thermal conductivity ($\kappa_{min}$) corresponds to the theoretical lower limits for the lattice component of thermal conductivity ($\kappa_g$) for the associated $IrSb_3$ compound. For the examples shown in FIG. 7, $LaGe_3$, $SmGe_3$, and $NdGe_3$ compounds were respectively synthesized then added to appropriate amounts of Ir and Sb to form the desired stoichiometric semiconductor compounds having a skutterudite type crystal lattice structure in accordance with teachings of the present invention. For some applications mixtures other than stoichiometric may be satisfactorily used.

During the fabrication process, the Ge ions were substitutionally placed in unit cell 50 at non-metal and/or semi-metal sites 66 in place of antimony (Sb). The Ge ions were substituted into the associated skutterudite type crystal lattice structure in an attempt to compensate for the charge associated with $La^{+3}$, $Nd^{+3}$ and $Sm^{+3}$ ions. If all of the voids as represented by subcells 54 and 57 in the resulting crystal lattice structure as represented by unit cell 50 are filled with very large diameter atoms such that the atoms completely fill the respective voids, phonon propagation will detect little disorder and thermal conductivity ($\kappa$) will be relatively high. However, if smaller diameter atoms or ions such as $La^{+3}$ or $Nd^{+3}$ or $Sm^{+3}$, are placed in normally void subcells 54 and/or 57, these relatively smaller atoms will "rattle" about in respective subcells 54 and/or 57 which typically have a much larger volume as compared with the diameter (volume) of such atoms. Therefore, the looser bonding associated with placing undersize atoms in normally void subcells 54 and/or 57 will create disorder subsequently resulting in a smaller value of $\kappa_g$.

The average ionic radii, in Å, for various ions in six and twelve coordinated (CN) sites taken from structural data of their respective oxides and fluorides is shown in Table II. Each of these ions may not be in a similar symmetry site when used to selectively fill a portion of normally void subcells or cubes 54 and 57 of a skutterudite type crystal lattice structure as represented by unit cell 50. The actual distance between ions may differ from these reported values. However, the overall trend in the size of these ions is clearly illustrated in the Table II. Table II demonstrates the many atoms or ions that may be placed in the normally void of compounds with skutterudite crystal lattice structure.

TABLE II

| ion | Na | K | Rb | Cs | Ca | Sr | Ba |
|---|---|---|---|---|---|---|---|
| charge | +1 | +1 | +1 | +1 | +2 | +2 | +2 |
| 12 CN | 1.44 | 1.74 | 1.87 | 2.02 | 1.49 | 1.58 | 1.74 |
| 6 CN | 1.13 | 1.52 | 1.63 | 1.84 | 1.14 | 1.30 | 1.50 |

| ion | Pb | Bi | Sm | Nd | Ce | La | Th |
|---|---|---|---|---|---|---|---|
| charge | +2 | +3 | +3 | +3 | +3 | +3 | +4 |
| 12 CN | 1.53 | 1.39 | 1.37 | 1.40 | 1.44 | 1.46 | 1.39 |
| 6 CN | 1.32 | 1.16 | 1.10 | 1.14 | 1.17 | 1.20 | 1.14 |

All of the voids can therefore be filled with undersize atoms and the atomic disorder caused by the "rattling" of the void fillers will scatter the lattice phonons. The result is a drastic reduction in the lattice component of thermal conductivity ($\kappa_g$). As shown in FIG. 7, the smaller the ion or atom used to fill void subcells associated with $IrSb_3$ alloys and compounds the larger the disorder that is produced and, therefore, the larger the reduction in the lattice component of thermal conductivity ($\kappa_g$). For some semiconductor materials fabricated in accordance with teachings of the present invention, more than one order of magnitude decrease in the lattice component of thermal conductivity ($\kappa_g$) was observed at room temperature. An even larger reduction of $\kappa_g$ was observed below room temperature.

Figure 8:
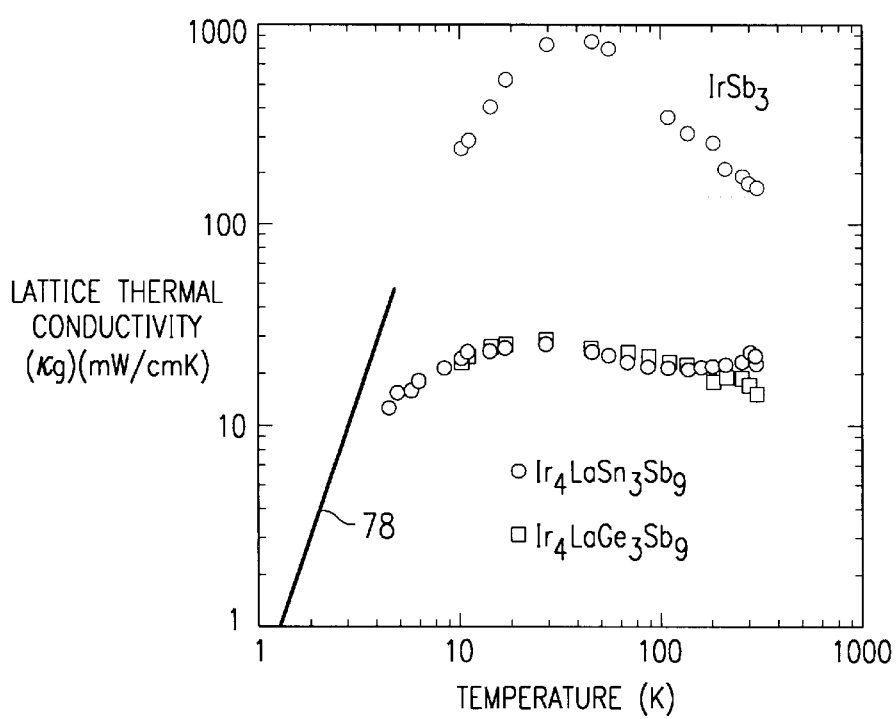
FIG. 8 is a graphical representation of the lattice component of thermal conductivity ($\kappa_g$) versus absolute temperature for semiconductor compounds $Ir_4LaGe_3Sb_9$ and $Ir_4LaSn_3Sb_9$ having skutterudite type crystal lattice structures with normally void subcells or cubes that have been essentially one hundred percent (100%) filled with $La^{+3}$ ions.

FIG. 8 is a graphical representation of the lattice compound of thermal conductivity ($\kappa_g$) versus temperature from combining partial void-filling with point defect scattering via mixed alloys of $Ir_4LaSn_3Sb_9$ and $Ir_4LaGe_3Sb_9$ filled skutterudites. The lattice component of thermal conductivity values are shown. As can be seen, the lattice component of thermal conductivity up to about 180 K was the same in both samples. Above this temperature, $Ir_4LaGe_3Sb_9$ has a lower lattice thermal conductivity than does $Ir_4LaSn_3Sb_9$. This is apparently due to additional mass fluctuation and strain field scattering from placing the smaller and less massive Ge atoms, as compared to Sb, in the skutterudite type crystal lattice structure as opposed to Sn atoms, which are very similar in size and mass to Sb atoms. This point defect type scattering has the greatest effect on high frequency phonons and, therefore, is prominent at higher temperatures.

In addition, the small decrease in the void size due to the Ge compensation, as opposed to the Sn compensated sample, does not significantly affect this decrease in the lattice component of thermal conductivity ($\kappa_g$). The "rattling" of $La^{+3}$ ions apparently affects the portion of the temperature range (phonon spectrum) that is not affected by point defect scattering (high frequency phonons) or grain boundary scattering (low frequency phonons). See FIG. 6. This is the range that often must be addressed in order to substantially reduce the lattice component of thermal conductivity ($\kappa_g$) in many semiconductor compounds.

Reported values for the lattice component of thermal conductivity ($\kappa_g$) measured at room temperature for alloys of various semiconductor compounds having polycrystalline skutterudite type crystal lattice structures as represented by unit cell 50 are shown in Table III. Alloying (or mixed crystals) results in a reduction in the lattice thermal conductivity ($\kappa_g$) as compared to $\kappa_g$=105 mW/cmK for a single crystal of $CoSb_3$ as shown in Table III. However, this reduction is not as large as in the case for filled skutterudites. This type of approach alone for reducing $\kappa_g$ will not result in $\kappa_g = \kappa_{min}$.

TABLE III

| Mixed Crystal | $\kappa_g$ ( mW cm$^{-1}$ K$^{-1}$) |
|---|---|
| $(IrSb_3)_{0.5}(RhSb_3)_{0.5}$ | 90 |
| $(CoSb_3)_{0.02}(CoAs_3)_{0.98}$ | 57 |
| $(IrSb_3)_{0.04}(CoSb_3)_{0.96}$ | 45 |
| $(IrSb_3)_{0.1}(CoSb_3)_{0.9}$ | 32 |
| $(IrSb_3)_{0.12}(CoSb_3)_{0.88}$ | 29 |
| $(IrAs_3)_{0.1}(CoSb_3)_{0.9}$ | 25 |

Straight line 78 of FIG. 8 represents a calculation of grain-boundary scattering due to temperature changes for seven (7) $\mu$ grain size, the estimated grain size for respective samples of $Ir_4LaSn_3Sb_9$ and $Ir_4LaGe_3Sb_9$. As can be seen in FIG. 8, the value of the lattice component of thermal conductivity ($\kappa_g$) for filled skutterudite type crystal lattice structure at low temperatures will be influenced by grain size of the associated samples. Ir—Co alloying should have a much larger effect on the lattice component of thermal conductivity ($\kappa_g$) than Ge—Sb alloying in the room temperature range.

Figure 9:
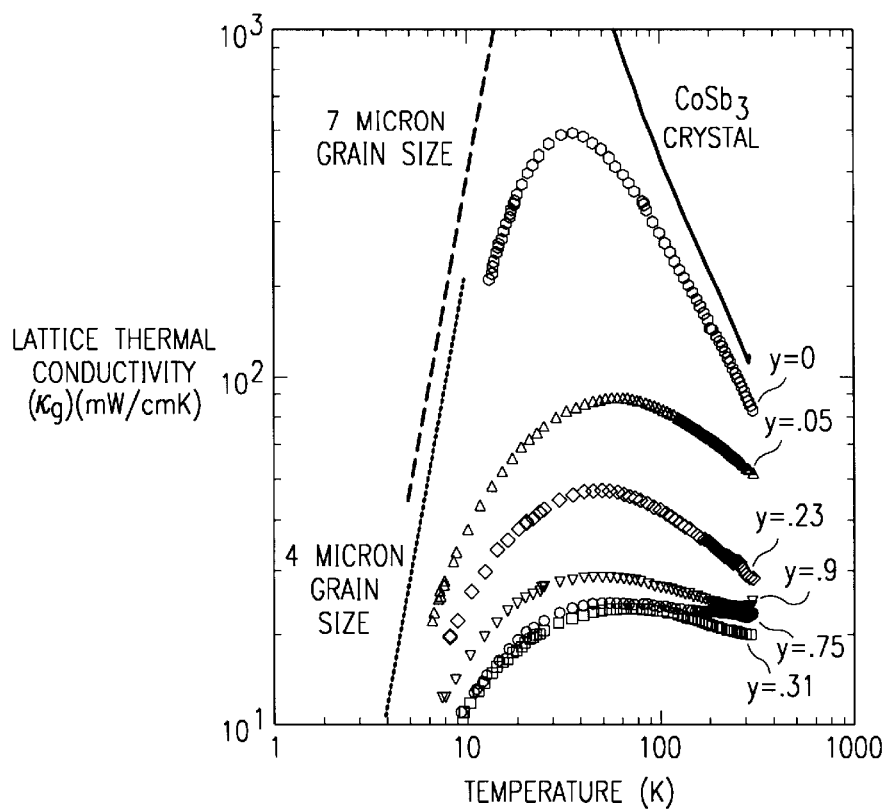
FIG. 9 is a graphical representation of the lattice component of thermal conductivity ($\kappa_g$) versus absolute temperature of several semiconductor compounds having the general formula $Co_4La_ySn_{3x}Sb_{12-3x}$ for selected values of y in comparison with binary semiconductor compounds of $CoSb_3$ with two different grain sizes.

Selected properties such as the lattice component of thermal conductivity ($\kappa_g$) may be substantially affected by filling only a portion of normally void subcells or cubes 54 and 57 associated with the respective skutterudite type crystal lattice structure. FIGS. 7–9 are graphical representations showing changes in the lattice component of thermal conductivity ($\kappa_g$) in response to filling only a selected portion of normally void subcells 54 and 57.

FIG. 9 shows the lattice component of thermal conductivity ($\kappa_g$) vs. absolute temperature (T) in the temperature range of 300 K down to 6 K for semiconductor compounds represented by the chemical formula $Co_4La_ySn_{3x}Sb_{12-3x}$ for values of y=0.31, 0.75, and 0.90 $La^{+3}$ ions in addition to $CoSb_3La_{0.23}Co_4Sb_{12}$ and $La_{0.05}Co_4Sb_{12}$. The $La^{+3}$ ions fill a portion of the normally void subcells 54 and 57 based on the value of y.

Single crystal $\kappa$ and $\kappa_{min}$ values for $CoSb_3$ are also included. For $CoSb_3$, $\kappa_{min}$ is approximately equal to 3.1 mW/cmK at room temperature. The dotted and dashed lines were calculated for polycrystalline samples with four (4) and seven (7) $\mu$m grain sizes, respectively. This comparison basically shows that low values of the lattice component of thermal conductivity ($\kappa_g$) for both filled and partially filled skutterudite type crystal lattice structures are not due to just grain boundary scattering. The lower value of the lattice component of thermal conductivity ($\kappa_g$) for y=0 as compared with a single crystal $CoSb_3$ is principally due to phonon scattering from grain boundaries.

When y is equal to 0, there is no filling of the normally void subcells or cubes 54 and 57 in the respective skutterudite type crystal lattice structure associated with $CoSb_3$. When y approaches 1, substantially all of the void subcells or cubes 54 and 57 in the associated skutterudite type crystal lattice structure will be filled by $La^{+3}$ ions. Filling only a selected portion of the void subcells or cubes 54 and 57 in the associated skutterudite type crystal lattice structure is represented by y=0.31 and y=0.75.

Figure 11:
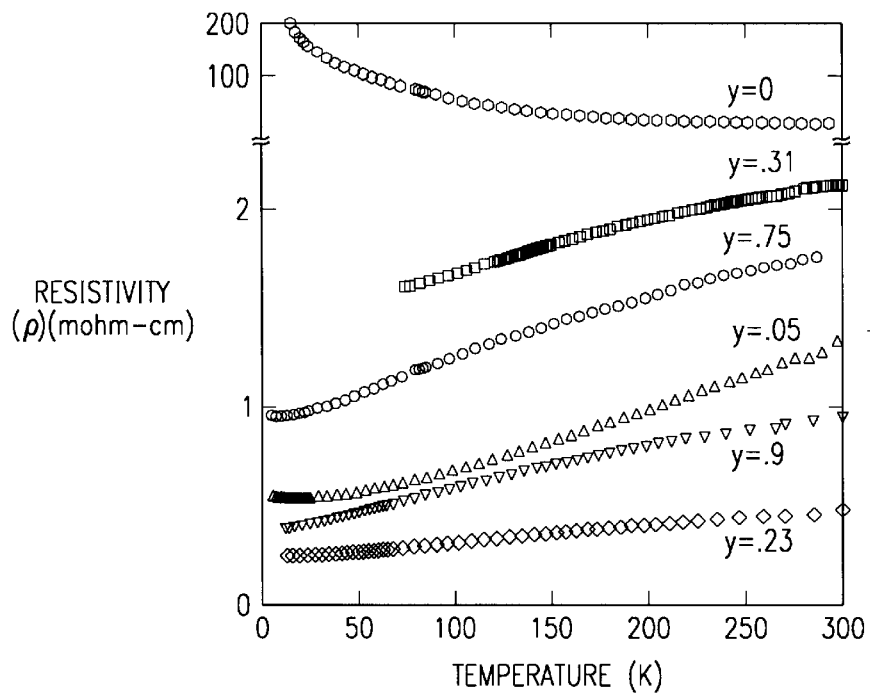
FIG. 11 is a graphical representation of electrical resistivity versus temperature for several semiconductor compounds having the general formula $Co_4La_ySn_{3x}Sb_{12-3x}$ for selected values of y with partially filled skutterudite type crystal lattice structures formed in accordance with teachings of the present invention.

The information plotted on the graph of FIG. 9 for values of y=0, 0.05, 0.23, 0.31, 0.75, and 0.90 were obtained by measuring the value of resistivity of the respective semiconductor compounds at various temperatures as shown in FIG. 11. The Wiedemann-Franz law may then be used to estimate the electronic component of thermal conductivity ($\kappa_e$). The lattice component of thermal conductivity ($\kappa_g$) may then be obtained by using the formula $\kappa_g = \kappa - \kappa_e$. The temperature dependence of the lattice component of thermal conductivity ($\kappa_g$) for CoSb$_3$ semiconductor compounds is typical of many semiconductor compounds having a skutterudite type crystal lattice structure. Values for the lattice component of thermal conductivity ($\kappa_g$) shown in FIGS. 7 and 8 were similarly obtained for the compounds shown in those figures.

The peak value of the lattice component of thermal conductivity ($\kappa_g$), as indicated on FIG. 9, is lower than values typically associated with a single crystal of CoSb$_3$ semiconductor compound due to the effects of using polycrystalline samples of CoSb$_3$ with a grain size of approximately seven (7) $\mu$m.

The data plotted on the graph of FIG. 9 for the lattice component of thermal conductivity ($\kappa_g$) is similar in magnitude and temperature dependence for values of y=0.31 and for values of y=0.75. However, the lattice component of thermal conductivity ($\kappa_g$) for skutterudite type crystal lattice structures with y=0.31 is slightly lower at temperatures approaching room temperature. Both values of $\kappa_g$ however are lower than the value of $\kappa_g$ for the almost completely filled y=0.90 sample. The information plotted on the graph of FIG. 9 clearly indicates that filling only a portion of normally void subcells or cubes 54 and 57 in the associated skutterudite type crystal lattice structure with La$^{+3}$ ions is more effective in scattering phonons and thus reducing the lattice component of thermal conductivity ($\kappa_g$) as compared to the same skutterudite type crystal lattice structure in which most (y=0.9) or many (y=0.75) of normally void subcells or cubes 54 and 57 have been filled.

Figure 10:
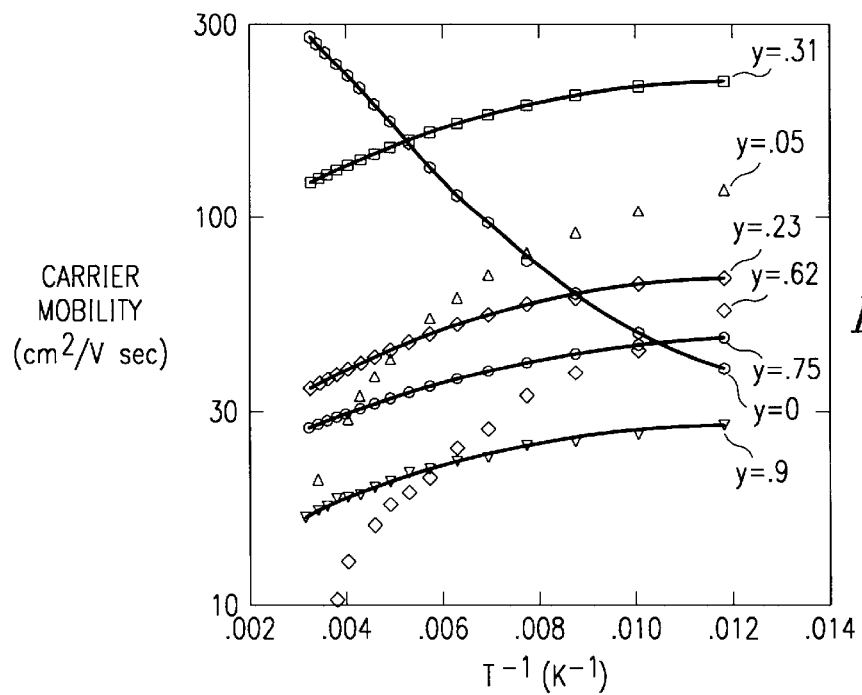
FIG. 10 is a graphical representation of carrier mobility versus inverse temperature for several semiconductor compounds having the general formula $Co_4La_ySn_{3x}Sb_{12-3x}$ for selected values of y with partially filled skutterudite type crystal lattice structures formed in accordance with teachings of the present invention.

FIG. 10 shows carrier mobility as a function of inverse temperature for seven semiconductor compounds having partially filled skutterudite type crystal lattice structures formed in accordance with teachings of the present invention shown in Table IV. The two N-type samples display a sharper decrease in mobility at increasing temperatures than do the P-type samples. FIG. 11 shows electrical resistivity, $\rho$, in a temperature range from 300 K to 6 K for six of the partially-filled skutterudites tabulated in Table IV.

Figure 12:
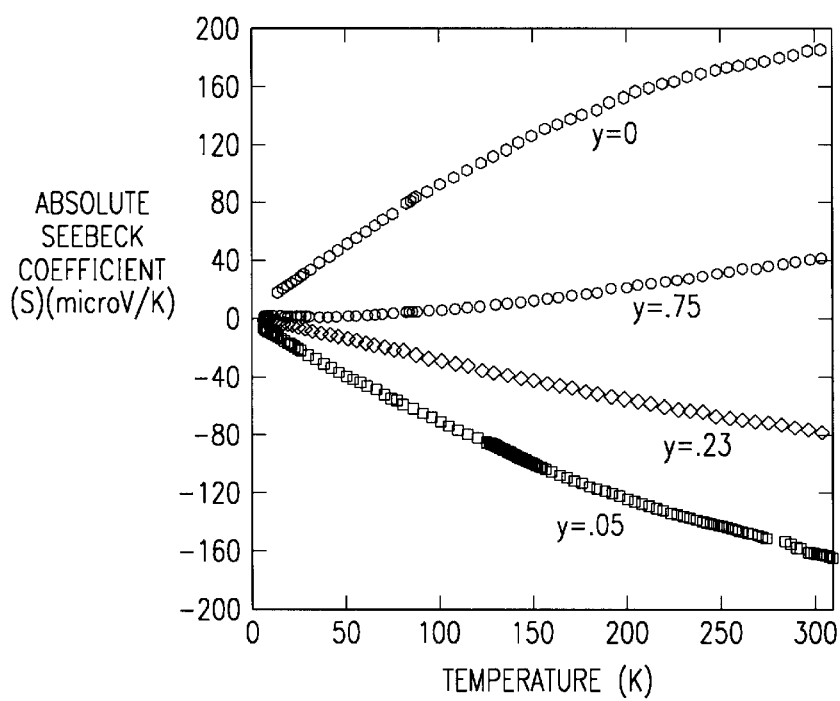
FIG. 12 is a graphical representation of absolute Seebeck coefficient versus temperature for several semiconductor compounds having the general formula $La_yCo_4Sb_{12}$(plus $Co_4La_{0.75}Sn_xSb_{12-3x}$) for selected values of y with partially filled skutterudite type crystal lattice structures formed in accordance with teachings of the present invention.

FIG. 12 shows the absolute value of S as a function of temperature from 300 K to 6 K for the y=0.75, 0.23 and 0.05 La-filled-skutterudite samples as well as for CoSb$_3$. The data for y=0.75 is typical in magnitude and temperature dependence of P-type skutterudites with filled or partially filled voids. The absolute value of S decreases with decreasing temperature in this temperature range. This is similar to measurements for other Ce and/or La filled skutterudites. The relatively low absolute value of S at room temperature for the Sn-compensated samples (as compared to S approximately equal to 80 $\mu$V/K at room temperature for RFe$_3$Co$_3$Sb$_{12}$ samples from the literature, where R=Ce or La) may be due to the fact that a stoichiometric mixture with a La to Sn ratio of exactly 1:3 was not achieved in these samples resulting in high carrier concentrations. For some applications, nonstoichiometric mixtures may be satisfactorily used to form thermoelectric elements in accordance with teachings of the present invention.

For the partially filled sample La$_{0.64}$Fe$_{2.79}$Co$_{1.1}$Sb$_{12}$, S=70 $\mu$V/K. The two N-type samples clearly show a higher magnitude of absolute value of S. From FIG. 12, the x=0.05 sample indicates the magnitude and temperature dependence is similar to that of undoped CoSb, even though the x=0.05 sample has a carrier concentration 80 times larger. The sign of S, of course, reversed.

In the case of the partially-filled skutterudites, the grain sizes were all $\geq 4\mu$m, therefore the magnitude and temperature dependence of $\kappa_g$ for all samples for temperatures greater than 45 K are not due to grain boundary scattering. In the case of the samples with grain sizes of 8 $\mu$m (see Table IV), scattering due to boundary scattering begins well below this temperature. From FIG. 9, the y$\geq$0.31 samples show a somewhat flat temperature dependence of $\kappa_g$ between 30 K and 300 K similar to that of 100% filled skutterudites.

As seen in Table IV the Sn-compensated compounds are P-type and the uncompensated, La-doped compounds are N-type. The N-type behavior is most likely due to the fact that the La$^{+3}$ ions donate their electrons without charge compensation. The ideal skutterudite has an electron count of 144 per cubic unit cell. Electrons in excess of this number produce N-type behavior. It should also be noted that these uncompensated, La-filled skutterudites as well as the Sn-compensated samples have a larger carrier mobility, shown in FIG. 10 and Table IV, than Fe-compensated samples with similar carrier concentration. It is apparent that there is substantially more carrier scattering caused by Fe substitution in Co skutterudite compounds than by Sn or other substitution.

From FIG. 10, a general trend is also apparent. At lower La$^{+3}$ ion concentrations, semiconductor materials with the partially filled skutterudite type crystal lattice structure have a higher carrier mobility as compared to similar semiconductor material with a substantially filled skutterudite type crystal lattice structure when adjusted to the same carrier concentration. This adjustment is needed since carrier mobility is generally dependent on carrier concentration. Therefore, the stoichiometry of a particular compound may determine carrier mobility and associated thermoelectric characteristics. The La$^{+3}$ ions in normally void subcells 54 and 57 of FIG. 3A appear to scatter charge carriers as well as phonons. Partial filling normally void subcells 54 and 57 may therefore be an approach for increasing carrier mobility in these semiconductor compounds for thermoelectric applications.

The absolute values of S are somewhat dependent on the carrier concentration, as observed in Table IV and FIG. 12. The relatively large absolute values of S for the N-type samples are presumably due to their large effective mass. These observations corroborate those of previous work on doped N-type CoSb$_3$. Employing FIG. 12, an estimate of the electron effective mass, m*, for the two N-type samples can be made in a straightforward fashion using Fermi statistics and assuming acoustic phonon scattering in a single-band model. The m* values thus calculated are 3.0 m$_o$ and 2.7 m$_o$ for the y=0.05 and x=0.23 N-type partially filled skutterudite samples, respectively, where m$_o$ is the free electron mass. These relatively large m* values are in agreement with band structure calculations which predict a heavy conduction band mass in N-type unfilled-skutterudites. It therefore appears that the La$^{+3}$ ions in these samples do not affect the band structure of CoSb$_3$ a great deal even though they dope the samples N-type. Partial filling may be a route toward optimizing both the electronic properties and $\kappa_g$ for thermoelectric applications.

Figure 13:
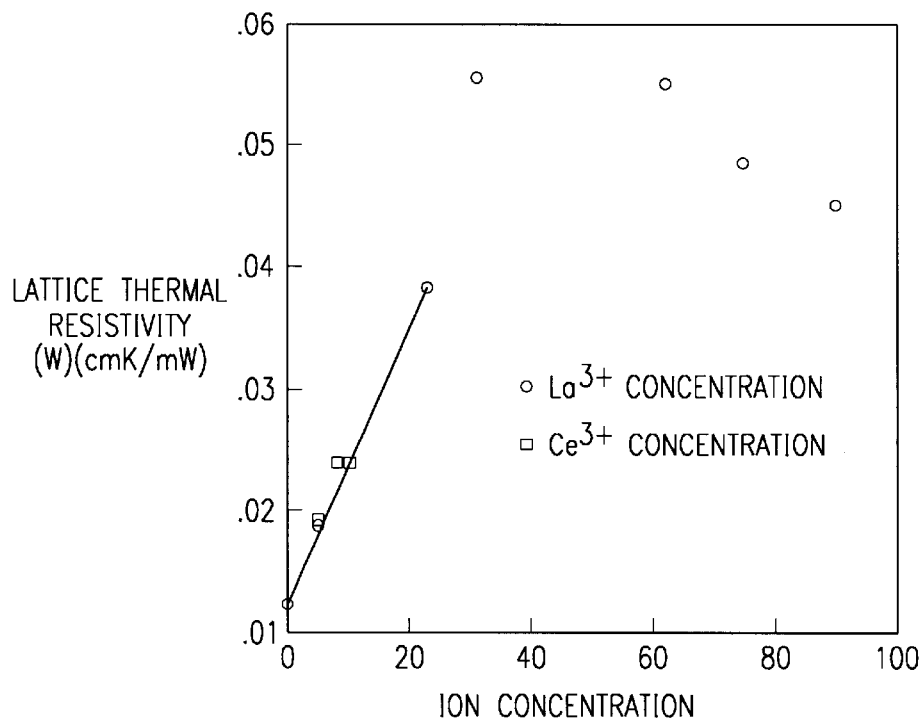
FIG. 13 is a graphical representation of the lattice thermal resistivity at room temperature versus $La^{+3}$ ion concentration and also published data with respect to $Ce^{+3}$ ion concentrations.

FIG. 13 shows the thermal resistivity, W, at room temperature as a function of the La$^{+3}$ concentration of the voids, y. Data from the literature for Ce$^{+3}$ versus y are also included. The solid line is a simple linear fit to the data points up to y=0.2. FIG. 13 shows an initial steep increase in W from only a small amount of La$^{+3}$ in the voids. The W levels off somewhat due to the disorder produced by the "rattling" La$^{+3}$ atoms in respective voids of this structure. This "rattling" model is the major phonon scattering mechanism that produces the low values of $\kappa_g$. However, a maximum exists at approximately y=0.5, or 50% void filling. This is similar to mass-fluctuation type scattering as outlined by Abeles. It is possible that the random distribution of $La^{+3}$ and voids in the skutterudite lattice introduces this additional phonon scattering, as opposed to an "ordered" system where all the voids are filled with $La^{+3}$ or all are empty.

FIGS. 9 and 13 indicate that placing only a small amount of La atoms in normally void subcells 54 and 57 associated with $CoSb_3$ reduces $\kappa_g$ substantially. The random distribution of $La^{+3}$ ions is more effective in scattering phonons than an arrangement in which all, or most, of normally void subcells 54 and 57 are filled. This indicates that more than one phonon scattering mechanism exists. The partial, random distribution of $La^{+3}$ in the voids introduces additional phonon scattering, other than the "rattling" effect of $La^{+3}$ in the voids. This would therefore result in a larger decrease in $\kappa_g$. Given that the masses and sizes of Sn and Sb atoms do not differ substantially, a significant effect on $\kappa_g$, as compared to Ge for example (see FIG. 8) would not be expected.

As seen in FIG. 13, the further reduction in $\kappa_g$ due to the partial filling of the voids still does not result in a value for $\kappa_g$ which is approximately equal to $\kappa_{min}$, calculated to be 3.1 mW/cmK at room temperature for $CoSb_3$. This additional reduction of $\kappa_g$ due to partial $La^{+3}$ filling may however be enhanced by other choices of ions, for example the larger mass trivalent lanthanide ions or actinide ions. In addition, recent x-ray diffraction data reveal that the smaller size, larger mass trivalent lanthanide ions may, at room temperature, reside in a corner of the void as opposed to the larger size, smaller mass trivalent lanthanide ions ($La^{+3}$ which statistically occupy the center of the void. This may introduce a static disorder in the lattice, in addition to the dynamic disorder due to the "rattling" of these ions in their voids. Such a disordered system would result in the optimum disorder, thereby producing the maximum reduction in $\kappa_g$, for partially-filling skutterudites. The lowest $\kappa_g$ values will be produced in crystals with several different void-occupants chosen so that they individually interact with the phonons in many different parts of the whole phonon spectrum. Since the La scattering is apparently most effective in a range between approximately y=0.25 to y=0.30, this means that 2 or possibly 3 different filling atoms would be more effective than any single kind of atom for 100% void-filling.

The increase in the room temperature W of $CoSb_3$ caused by the lanthanum additive appears to reach a maximum (or at least a saturation value) at approximately y=0.5, i.e. when just half of the voids are filled. The random occupation of the void sites produces a mass fluctuation scattering of phonons. The theory of this scattering has been worked out by Callaway and Abeles. As a result, the expected effect of this scattering on the room temperature value of $\kappa$ may be calculated from this theory. First, the mass fluctuation scattering parameter, $\Gamma$, for a ternary crystal of composition $A_aB_bC_c$ is given by $$\Gamma = \sum x_i \left(1 - \frac{m_i}{M}\right)^2 \quad (4)$$

where M is the mass of an average ternary cluster with a total number of atom sites equal to a+b+c. Then $m_i$ is the mass of the particular cluster, i. If A=Co, B=Sb and C=La or a vacancy, then c=1 when a=4 and b=12 and M=4 M(Co)+12 M(Sb)+x M(La) with 0<x<1. Here x is the fractional occupation of the voids by La. The expression for $\Gamma$ then becomes $$\Gamma = \sum x(1-x)\left[\frac{M(La)}{M}\right]^2 \quad (5)$$

For very small values of x, $\Gamma$ will be approximately $6.7026 \times 10^{-3}$. W in the high temperature region where the temperature is comparable to the Debye temperature, $\Theta$, is given by $$\frac{W}{W_p} = \left[1 + \frac{5a}{9}\right]\left[V + \frac{(1-V)^2}{\left(\frac{1+a}{5a}\right)U^4 - \frac{1}{3}U^2 + (1-V)}\right]^{-1} \quad (6)$$

The various symbols are defined by $V=(\tan^{-1}U)/U$, $U_o=U/(1+5\alpha/9)$, $U_o^2=3GT/W_p$, and $G=(\pi^4/48)^{1/3}h\delta/k^2\Theta)$ where $\alpha$ is the ratio of the phonon umklapp scattering relaxation time to the phonon normal scattering relaxation time, $\delta^3$ is the average volume per atom of the crystal, $\Gamma$ is the mass fluctuation scattering parameter, $\Theta$ is the Debye temperature of $CoSb_3$, $W\rho$ is the thermal resistivity of pure, undoped CoSb, at the temperature in question, h is Planck's constant and k is Boltzmann's constant.

The parameter values for $CoSb_3$ at 300 K are, from Table V, $\Theta$=307 K, $W\rho$=9.52 cmK/W and $\delta$=2.846×10$^{-8}$ cm. These yield G=408.0 cmK/W, $\Gamma$(x=0.5)=1.5464×10$^{-3}$ and $U_o$(300 K, x=0.5)=0.4458. From these numbers the expected value of $\kappa_g$ for a La-doped skutterudite at 300 K with x=0.5 at various values of the parameter $\alpha$ may be calculated. The results are tabulated in Table V. These results show that the simple mass fluctuation scattering produced by the $La^{+3}$ in the voids is nowhere nearly sufficient to explain the observed W at y=0.5, 300 K, of about 55 cmK/W for any value of $\alpha$.

The value of $\alpha$ appropriate for skutterudites can be obtained from the $\kappa_g$ values observed on $IrSb_3$—$RhSb_3$ mixed crystals, see Table III). The Ir and Rh atoms have almost identical radii in the skutterudite structure. Thus the strain-field scattering is zero, and Rh behaves almost like a light isotope of Ir. In this case, for 50 atomic % Rh in IrSb3 the value of $\Gamma$=7.72×10$^{-3}$. Using equation (6) at 300 K where W($Ir_{0.5}Rh_{0.5}Sb_3$)/W($IrSb_3$)=1.78 the best agreement is for $\alpha$=2.75. For Si—Ge mixed crystals Abeles found $\alpha$=2.5, so the above value is reasonable. If $\alpha$=2.75 is used, at fifty percent $La^{+3}$ filling in $CoSb_3$, the calculated W from the mass fluctuation is much lower than the observed effect. There is almost zero strain-field scattering to be expected for La atoms in the voids. The $La^{+3}$ ions have a diameter only 77% of the void diameter in $CoSb_3$, from Tables I and II. This is reinforced by the x-ray measurements on $LaFe_4Sb_{12}$ skutterudite compounds which show that the Fe—Sb framework is too large for the La ions.

Consider the linear W(x) behavior shown in FIG. 13 for x≤2. Both La and Ce give dW/dx=128 cmK/W. The formulas of Abeles may be used to compute the initial slope expected for the mass-fluctuation scattering of La and Ce. The result is, for all values of $\alpha$:

$$\frac{dW}{dx} = \frac{27(21 + 42\alpha + 25\alpha^2)d\Gamma}{7(81 + 90\alpha + 25\alpha^2)^{dx}} G \quad (7)$$

For $\alpha$=2.75, then dW/dx=6.63 cmK/W. Thus the observed dW/dx is 19 times larger than would be expected from the mass fluctuation scattering of the La and Ce alone. Some other, as yet not fully understood, phonon scattering mechanism is apparently involved.

The concentration of $La^{+3}$ in the voids, y, exact stoichiometry of the samples, using electron-beam microprobe analysis, cubic x-ray lattice parameter, $a_o$, average grain size, bulk density as a fraction of theoretical density, D%, carrier concentration, mobility and absolute S for $CoSb_3$, and the partially-filled-skutterudites of typical compounds with the skutterudite crystal lattice structure with their voids partially filled with $La^{+3}$ ions is shown in Table IV. The electrical and x-ray data were taken at room temperature. All samples are P-type with the exception of the y=0.05 and y=0.23 samples which were N-type. The cubic unit cell in each case contains twice the number of formula units shown.

subcells or cubes 54 and 57 in the associated skutterudite type crystal lattice structure not only reduces thermal conductivity ($\kappa$) but also reduces the associated electrical properties ($S^2\sigma$) which may result in no increase or even a decrease in the resulting thermoelectric figure of merit (ZT). For some semiconductor compounds, a net reduction in the thermoelectric figure of merit (ZT) may occur. Selectively filling only a portion of void subcells or cubes 54 and 57 in the associated skutterudite type crystal lattice structure helps to minimize any reduction in the electrical properties ($S^2\sigma$)

TABLE IV

| y | Sample | $a_o(\text{Å})$ | grain size ($\mu$m) | D % | carrier conc. ($10^{18} cm^{-3}$) | mobility ($cm^2$/Vsec) | absolute S ($\mu$V/K) |
|---|---|---|---|---|---|---|---|
| 0 | $Co_4Sb_{12}$ | 9.032 ± 0.011 | 7 | 97 | 1.88 | 270 | 185 |
| 0.05 | $La_{0.05}Co_4Sb_{12}$ | 9.056 ± 0.017 | 5 | 94 | 170 | 20.5 | -168 |
| 0.23 | $La_{0.23}Co_4Sb_{11.6}$ | 9.060 ± 0.013 | 5 | 93 | 2010 | 6.83 | -78 |
| 0.31 | $La_{0.31}Co_4Sn_{1.48}Sb_{11.2}$ | 9.064 ± 0.002 | 4 | 94 | 27.0 | 121 | 17 |
| 0.62 | $La_{0.62}Co_4Sn_{2.4}Sb_{9.9}$ | 9.094 ± 0.007 | 4 | 93 | 122 | 36.6 | 40 |
| 0.75 | $La_{0.75}Co_4Sn_{2.58}Sb_{9.78}$ | 9.096 ± 0.010 | 8 | 85 | 112 | 28.9 | 41 |
| 0.9 | $La_{0.9}Co_4Sn_{2.84}Sb_{10.03}$ | 9.102 ± 0.006 | 8 | 94 | 308 | 16.7 | 32 |
| 0.64 | $La_{0.64}Fe_{2.79}Co_{1.1}Sb_{12}$ | 9.118 ± 0.004 | 7 | 94 | 365 | 25.9 | 70 |
| 0.9 | $La_{0.9}Ru_{2.7}CoSb_{12}$ | 9.244 ± 0.010 | 10 | 86 | 192 | 43.1 | 15 |

For the example shown in Table IV in which y equals 0.05, approximately five percent (5%) of the void subcells 54 and 57 have been filled with $La^{+3}$ ions. As a result, the nearest void subcells or cubes 54 and 57 surrounding each subcell 54 or 57 filled with a $La^{3+}$ ion will generally be empty.

Table IV further confirms this trend with respect to varying the number of normally void subcells or cubes 54 and 57 which have been filled in accordance with teachings of the present invention. The carrier concentration of holes of the samples which have only a portion of the normally void subcells or cubes 54 and 57 filled are approximately a factor of three less than the sample of $CoSb_3$ semiconductor material in which approximately one hundred percent (100%) of the void subcells or cubes 54 and 57 have been filled (y=0.9).

When y is equal to zero (essentially no filling of the normally void subcells or cubes 54 and 57 associated with semiconductor compound $CoSb_3$), the value of the hole concentration is an order of magnitude greater. In addition, the carrier mobility increases as the concentration of $La^{-3}$ ion concentration in the now filled subcells or cubes 54 and 57 decreases. The lower concentration of $La^{+3}$ ions apparently results in less scattering of the charge carriers and thereby results in less degradation of the electrical properties ($S^2\sigma$).

Calculated values of the thermal conductivity, $\kappa$, and resistivity, W, of $CoSb_3$ doped with La at a concentration y and at room temperature versus $\alpha$ as shown in Table V.

TABLE V

| $\kappa$(mW/cmK) | y | $\alpha$ | W(cmK/W) |
|---|---|---|---|
| 105 | 0.0 | — | 9.52 |
| 101 | 0.5 | 0.0 | 9.88 |
| 98.8 | 0.5 | 1.0 | 10.12 |
| 92.3 | 0.5 | 2.0 | 10.83 |
| 91.1 | 0.5 | 2.75 | 10.98 |
| 90.7 | 0.5 | 3.0 | 11.02 |
| 78.2 | 0.5 | ∞ | 12.79 |

The results shown in FIGS. 9, 10, 11 and 12 are very useful since the amount of $La^{+3}$ ions used to fill void subcells or cubes in the associated lattice structure helps to minimize any reduction in the electrical properties ($S^2\sigma$) while at the same time increasing the desired reduction in thermal conductivity ($\kappa$).

Semiconductor compounds may be formed in accordance with teachings of the present invention with several general formulas such as:

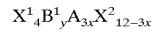

Where $X^1$ and $X^2$ normally form a binary semiconductor compound having a skutterudite crystal lattice structure; or

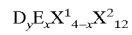

with D selected from the group consisting of La, Ce, Pr, Sm, Eu, Gd, Tb, Dy, Ho, Er, Tm, Yb, Lu, K,Th,Pa, U, Sn, Pb, Bi, Br and I; E is selected from the group consisting of Ni, Pd, Co, Rh, Ir, Ru, Os and Fe; $X^1$ selected from the group consisting of Sn, Ge, In, Ga, and Si; $X^2$ selected from the group consisting of Sb, P, and As.

For some application, the value of x may be in the range of equal to or greater than zero and equal to or less than one. The value of y will generally be greater than zero.

Also, for some semiconductor compounds formed in accordance with teachings of the present invention the value of y may be substantially equal to the value of x. For other semiconductor compounds formed in accordance with teachings of the present invention, y and x may have different values.

For the various semiconductor compounds represented by the results shown in FIGS. 9, 10, 11 and 12, y and x have substantially the same value.

For some semiconductor materials, the peak value of the thermoelectric figure of merit (ZT) may be obtained by filling approximately only ten percent (10%) of the void subcells or cubes in the associated lattice structure. For other semiconductor materials having skutterudite type crystal lattice structures, the peak value of the thermoelectric figure of merit (ZT) may be obtained by filling approximately twenty percent (20%) of the void subcells or cubes in the associated lattice structure. For still other semiconductor materials having skutterudite type crystal lattice structures, the peak value of the thermoelectric figure of merit (ZT) may be obtained by filling approximately fifty percent (50%) of the void subcells or cubes in the associated lattice structure. The desired percentage of filling will generally depend on the specific atom used for such filling and the specific void size for each skutterudite type crystal lattice structure.

The optimum percentage of void subcells or cubes 54 and 57 which are filled in accordance with teachings of the present invention will often depend upon the intended use for the resulting thermoelectric device. For example, thermoelectric device 20 having a plurality of thermoelectric elements 22 formed from the same semiconductor material will often have a different thermoelectric figure of merit (ZT) when the thermoelectric device 20 is used for cooling as compared when thermoelectric device 20 with thermoelectric elements 22 formed from the same semiconductor material is used for electrical power generation. Important technical benefits of the present invention include optimizing the number of normally void subcells 54 and 57 in a skutterudite type crystal lattice structure which are filled based on both the type of semiconductor material, the atoms or molecules used to fill a selected number of normally void subcells 54 and 57 and the intended application for the resulting thermoelectric device.

Binary semiconductor compounds $IrSb_3$, $CoSb_3$ and $RhSb_3$ with skutterudite type crystal lattice structures as represented by unit cell 50 have demonstrated at room temperature the characteristics shown in the following Table VI.

TABLE VI

| Quantity | Units | $IrSb_3$ | $CoSb_3$ | $RhSb_3$ |
|---|---|---|---|---|
| type | | p | p | p |
| electrical cond. | $ohm^{-1}cm^{-1}$ | 2330 | 2500 | 2940 |
| carrier mobility | $cm^2V^{-1}sec^{-1}$ | 1320 | 2445 | 8000 |
| carrier consent. | $10^{18}cm^{-3}$ | 11 | 1.2 | 3.5 |
| Seebeck coeff. | $\mu V\ K^{-1}$ | 72 | 220 | 60 |
| hole effective mass | free electron mass | 0.17 | 0.15 | |
| bandgap | eV | 1.4 | 0.6 | 0.8 |
| lattice thermal conductivity | $mW\ cm^{-1}\ K^{-1}$ | 160 | 105 | 150 |
| lattice constant | Å | 9.2503 | 9.0385 | 9.2322 |
| x-ray density | $g\ cm^{-3}$ | 9.356 | 7.69 | 7.893 |
| Debye temperature | K | 308 | 306 | — |
| void radius | Å | 2.04 | 1.89 | 2.02 |

Some of the mechanical properties of $Bi_2Te_3$, $Si_{0.8}Ge_{0.2}$ semiconductor materials which are presently used to fabricate thermoelectric elements and two binary semiconductor compounds $IrSb_3$ and $CoSb_3$ at room temperature are shown in Table VII which lists some of these properties at room temperature for presently used thermoelectric materials in comparison with two binary semiconductor compounds having skutterudite type crystal lattice structures.

As seen in Table VII, the binary skutterudite compounds compare favorably with those of presently used, thermoelectric materials. Thermal expansion of $IrSb_3$ and $CoSb_3$ is much lower than the tellurides. $IrSb_3$ and $CoSb_3$ are much stronger. In addition, the cubic structure of skutterudite compounds eliminates the degradation in thermoelectric properties due to the anisotropy associated with pressed-powder synthesis techniques.

In Table VII, D is the density, $C_p$ is the specific heat at constant pressure, $\alpha$ is the thermal expansion coefficient, B is the bulk modulus, $v_L$ and $v_T$ are the average longitudinal and transverse sound velocities, and M.P. is the melting point. For $IrSb_3$ and $CoSb_3$, M.P. refers to the peritectic decomposition temperature.

TABLE VII

| Comp | D (g/cm$^3$) | $C_p$ (J/cm$^3$K) | $\alpha$ (10$^6$/K) | B (GPa) | $V_L$ (10$^5$cm/s) | $V_T$ (10$^5$cm/s) | M. P. (K) |
|---|---|---|---|---|---|---|---|
| $Bi_2Te_3$ | 7.86 | 1.22 | $\alpha\perp$ = 14.4<br>$\alpha//$ = 21.3 | 37.0 | 2.93 | 1.71 | 858 |
| $Si_{0.8}Ge_{0.2}$ | 2.99 | 1.66 | 2.94 | 91.7 | 7.73 | 4.67 | 1548 |
| PbTe | 8.28 | 1.25 | 19.8 | 41.1 | 3.08 | 1.84 | 1187 |
| $IrSb_3$ | 9.36 | 1.68 | 6.7 | 112 | 4.68 | 2.72 | 1414 |
| $CoSb_3$ | 7.63 | 1.72 | 6.4 | 90.0 | 4.59 | 2.64 | 1146 |

Single phase polycrystalline samples filled and partially filled skutterudites were similarly prepared as follows, though other synthesis techniques may also be suitable. First the high purity lanthanides, in lump form, were reacted with high purity germanium powders (Ge) or tin lumps (Sn) in the desired ratio of 1:3 at 960 C. for 2 days. All lanthanide elements and compounds were handled in an argon or nitrogen atmosphere due to the fact that they are highly reactive in air. The resulting mixture was ground to a fine powder with either a boron carbide (BC) or alumina mortar and pestle. It was then mixed and reacted with selected amounts of metal (e.g. iridium (Ir) or cobalt (Co)) and antimony (Sb) powders for 2 days. In the case of the skutterudites with Ir, this reaction temperature was 960 C. and in the case of the Co skutterudites the reaction temperature was 800 C. In all cases, the powder was held in a chemically vapor deposited pyrolytic boron nitride (BN) crucible which itself was sealed inside an evacuated, fused quartz ampule. In some cases this ampule was heated in an external atmosphere of flowing argon in order to prevent the inward diffusion of air and water vapor during the run. In other cases, no oxygen flow was used. The product was removed from the ampule, ground into fine powder in a BC or alumina mortar and pestle, passed through a 400 mesh sieve, cold pressed at a pressure of 60,000 lb/in$^2$ into generally cylindrical pellets, reloaded into a BN crucible and re-reacted for another two days at 960 C. (for the skutterudites with Ir) and 700 C. (for those with Co) as described above. After removal, the resulting charge was again ground into fine powder and passed through a 400 mesh sieve for densification.

In the case of the samples containing Fe or Ru, the high purity elements of La, Co, Sb and either Fe or Ru were mixed in generally stoichiometric quantities and reacted at 800 C. in a procedure similar to that described above.

Densification was accomplished in two ways. One was to cold press the powdered samples into generally cylindrical pellets and then sealed inside of an evacuated Pyrex ampule. A 2.5×10$^{-3}$ cm thick tantalum foil surrounded the ingot to prevent sticking. This ampule was then placed in a hot isostatic press where the ingots were consolidated at 925 C. for two hours at 29,500 lb/in² of argon pressure. The resulting ingot was slowly cooled at 2 C./minute to room temperature in order to avoid fracturing. Another procedure was to pour the powdered sample into a graphite die and uniaxial press it at 650 C. and 26,000 lb/in² for two hours.

The annealed samples were ground and analyzed by x-ray diffractometry. Metallographic and electron-beam microprobe examination of the polished surface of each sample, after densification, verified the stoichiometry of the samples.

The above procedures may be used to fill a selected portion of the normally void subcells or cavities in a skutterudite type crystal lattice structure with atoms selected from the group consisting of La, Ce, Pr, Sm, Ec, Gd, Tb, Dh, Ho, Er, Tm, Yb, Lu, K, Th, Pa, U, Sn, Pb, Bi, Br and I.

Figure 14:
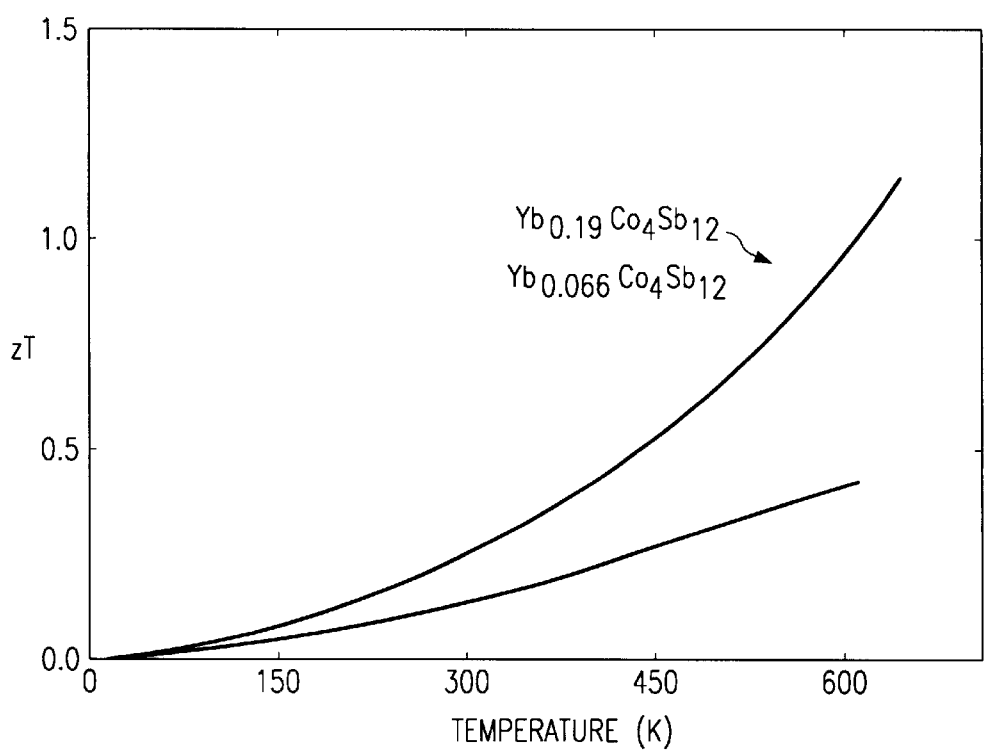
FIG. 14 is a graphical representation of the thermoelectric figure of merit (ZT) versus absolute temperature ($\kappa$) for two semiconductor compounds having skutterudite type crystal lattice structures with normally void subcells partially filled by ytterbium (Yb) atoms in accordance with teachings of the present invention.

FIG. 14 shows ZT as a function of temperature for two Yb-filled skutterudite type crystal lattice structures. The $Yb_{0.19}Co_4Sb_{12}$ semiconductor compound ZT~0.3 at room temperature and ZT>1 at temperature>300 C. The room temperature power factor ($S^2/\rho$) for these two semiconductor compounds is relatively high compared to known thermoelectric materials such as $Bi_2Te_3$ alloy materials currently used in thermoelectric devices. Filling selected voids with Yb atoms allows for more interstitial Yb atoms in the voids before degradation of $S^2\sigma$, as compared to trivalent lanthanide ions (e.g. La or Ce), while also having lower $\kappa$ due to the larger (smaller) mass (size) of Yb atoms as compared to Ce or La. The large electron effective mass of Yb-filled skutterudites also results in large $S^2/\rho$ values for this relatively highly doped compound. The high ZT in this compound is therefore a result of partial filling of normally void subcells and the large electron effective mass resulting from Yb-filling in $CoSb_3$.

Although the present invention has been described in detail, it should be understood that various changes, substitutions and alterations can be made herein without departing from the spirit and the scope of the invention as defined in the following claims.

APPENDIX

DEFINITIONS AND EXPLANATION OF SYMBOLS

| | |
|---|---|
| Absolute Temperature | K |
| Angstrom | Å |
| Electrical Conductivity | σ |
| Electrical Properties of Materials Used to Form Thermoelectric Elements | $S^2\sigma$ |
| Electrical Resistivity | ρ |
| Electronic Component of Thermal Conductivity | $\kappa_e$ |
| Lattice Component of Thermal Conductivity | $\kappa_g$ |
| Seebeck coefficient | S |
| Thermal Conductivity (mW/cmK) | κ |
| Thermal Resistivity (cmK/mW) | W |
| Thermoelectric Figure of Merit | ZT |
| ELEMENTS | SYMBOL |
| Actinium | Ac |
| Antimony | Sb |
| Arsenic | As |
| Barium | Ba |
| Bismuth | Bi |
| Bromine | Br |
| Cadmium | Cd |
| Cerium | Ce |
| Cobalt | Co |
| Dysprosium | Dy |
| Europium | Eu |
| Gallium | Ga |
| Germanium | Ge |
| Indium | In |
| Iodine | I |

APPENDIX-continued

DEFINITIONS AND EXPLANATION OF SYMBOLS

| | |
|---|---|
| Iridium | Ir |
| Iron | Fe |
| Lanthanum | La |
| Lead | Pb |
| Neodymium | Nd |
| Nickel | Ni |
| Niobium | Nb |
| Osmium | Os |
| Palladium | Pd |
| Phosphorous | P |
| Platinum | Pt |
| Potassium | K |
| Rhodium | Rh |
| Ruthenium | Ru |
| Rhenium | Re |
| Samarium | Sm |
| Selenium | Se |
| Silicon | Si |
| Silver | Ag |
| Sulphur | S |
| Tellurium | Te |
| Tin | Sn |
| Ytterbium | Yb |

What is claimed is:

1. A method of preparing a semiconductor compound for use in fabricating thermoelectric elements, the semiconductor compound having a partially filled skutterudite crystal lattice structure comprising:

filling a selected portion of normally void subcells by mixing two elements B and A in a selected ratio to form a mixture of the two elements;

sealing the mixture of B and A in a container having an inert gas atmosphere and heating the container for a preselected time at a preselected temperature to form an intermediate product;

crushing the intermediate product and mixing the crushed intermediate product with a generally stoichiometric ratio of elements $X^1$ and $X^2$ which normally form a binary semiconductor compound having a skutterudite crystal lattice structure to form a second mixture; and heating the second mixture for a second preselected time at a second preselected temperature in a sealed container having an inert gas atmosphere to form the semiconductor compound with the general formula:

$$X_4^1 B_y^1 A_{3x} X^2_{12-3x}$$

y selected to be in the range of greater than zero and less than one to fill the selected portion of normally void subcells to optimize the thermoelectric figure of merit.

2. The method of claim 1 wherein the semiconductor material has the general formula $Co_4Ln_yA_3Sb_{12-3x}$ and A is selected from the group consisting of Ge, Sn, In, Ga, Bi and Si with Ln representing lanthanide elements.

3. The method of claim 1 wherein the semiconductor material has the formula $Ir_4Ln_yA_3Sb_{12-3x}$ and A is selected from the group consisting of Ge, Sn, In, Ga, Bi and Si with Ln representing lanthanide elements.

4. The method of claim 1 wherein the semiconductor material has the formula $Rh_4Ln_yA_3Sb_{12-3x}$ and A is selected from the group consisting of Ge, Sn, In, Ga, Bi and Si with Ln representing lanthanide elements.

5. The method of claim 1 wherein the selected ratio comprises a substantially stoichiometric mixture for elements B and A.

6. A method for preparing a semiconductor compound to optimize desired thermoelectric characteristics, the semiconductor compound having a partially filled skutterudite crystal lattice structure, comprising:

filling a selected portion of normally void subcells by mixing elements D, E, $X^1$ and $X^2$ in a selected ratio to form a mixture having atoms sized to fill the selected portion of normally void subcells;

sealing the mixture of elements D, E, $X^1$ and $X^2$ in a container and heating the container for a preselected time at a preselected temperature to form an intermediate product; crushing the intermediate product; and heating the intermediate product for a second preselected time at a second preselected temperature to form the semiconductor compound with the general formula:

$$D_y E_x X^1_{4-x} X^2_{12}$$

with D selected from the group consisting of La, Ce, Pr, Sm, Eu, Gd, Tb, Dy, Ho, Er, Tm, Yb, Lu, K, Th, Pa, U, Sn, Pb, Bi, Br and I;

E selected from the group consisting of Co, Rh and Ir;

$X^1$ selected from the group consisting of Ni, Pd, Ru, Os, Pt and Fe;

$X^2$ selected from the group consisting of Sb, P, As, Bi, Sn, In, Ga, Ge, Si or a combination thereof; and y selected to be in the range of greater than zero and less than one to fill the selected portion of normally void subcells to optimize the thermoelectric figure of merit.

7. The method of claim 6 wherein the value of x is selected to be in the range of greater than zero and less than one for filling the selected portion of the normally void subcells to optimize the thermoelectric figure of merit.

8. The method of claim 6 wherein the selected ratio comprises a substantially stoichiometric mixture for elements D, E, $X^1$ and $X^2$.

9. A thermoelectric device having at least one thermoelectric element formed in part from at least one material having a skutterudite crystal lattice structure comprising:

multiple unit cells with each unit cell having thirty-two atomic crystallographic sites;

each unit cell having eight subcells with six of the subcells filled with planar rings of four atoms of one or more semimetal or nonmetal atoms and two subcells which normally define a respective void space within the skutterudite crystal lattice structure;

a selected portion of the normally void subcells respectively filled with a metal, semimetal or nonmetal atom; and each unit cell of the skutterudite crystal lattice having eight metal atom sites and twenty-four nonmetal or semimetal atom sites.

10. The thermoelectric device as defined in claim 9 further comprising at least one of the metal atom sites occupied by cobalt, rhodium or iridium.

11. The thermoelectric device as defined in claim 9 further comprising at least one of the semimetal or nonmetal atom sites occupied by antimony.

12. The thermoelectric device as defined in claim 9 wherein the selected portion comprises approximately fifty percent of the normally void subcells respectively filled.

13. The thermoelectric device as defined in claim 9 wherein the selected portion comprises approximately twenty percent of the normally void subcells respectively filled.

14. The thermoelectric device as defined in claim 9 wherein the selected portion comprises approximately ten percent of the normally void subcells respectively filled.

15. The thermoelectric device as defined in claim 9 wherein the material having the skutterudite crystal lattice structure further comprises:

a semiconductor compound having the formula $Co_4 B_y A_{3x} Sb_{12-3x}$;

A selected from the group consisting of Sn, Ge, In and Ga;

B selected from the group consisting of the group I elements, group II elements, lanthanides, actinides, or a combination thereof;

the value of y equal to or greater than zero;

the value of x equal to or greater than zero; and the value of y may not equal the value of x.

16. The thermoelectric device as defined in claim 15 further comprising the value of y equal to or less than one.

17. The thermoelectric device as defined in claim 9 wherein the selected portion of the normally void subcells have been filled by atoms selected from the group consisting of La, Ce, Pr, Sm, Eu, Gd, Tb, Dy, Ho, Er, Tm, Yb, Lu, K, Th, Pa, U, Sn, Pb, Bi, Br and I.

18. The thermoelectric device as defined in claim 9 wherein the material having the skutterudite crystal lattice structure further comprises:

a semiconductor compound selected from the group consisting of $D_y Ru_x Co_{4-x} Sb_{12}$, and $D_y Fe_x Co_{4-x} Sb_{12}$; and D selected from the group consisting of La, Ce, Pr, Sm, Eu, Gd, Tb, Dy, Ho, Er, Tm, Yb, Lu, K, Th, Pa, U, Sn, Pb, Bi, Br and I.

19. The thermoelectric device as defined in claim 18 wherein the value of y may be equal to or less than one.

20. The thermoelectric device of claim 19 wherein the selected portion of the normally void subcells are filled with atoms selected from the group consisting of La, Ce, Pr, Sm, Eu, Gd, Tb, Dy, Ho, Er, Tm, Yb, Lu, K, Th, Pa, U, Sn, Pb, Bi, Br and I.

21;. The thermoelectric device as defined in claim 9 further comprising the selected portion of the normally void subcells respectively filled with one of at least two different metal, semimetal or nonmetal atoms.

22. A thermoelectric device formed in part from at least one material having a skutterudite crystal lattice structure comprising:

multiple unit cells with each unit cell having thirty-two atomic crystallographic sites;

each unit cell having eight subcells with six of the subcells filled with planar rings of four atoms of one or more semimetal or nonmetal atoms and two subcells which normally define a respective void space within the skutterudite crystal lattice structure;

a selected portion of the normally void subcells respectively filled with a metal, semimetal or nonmetal atom;

each unit cell of the skutterudite crystal lattice having eight metal atom sites and twenty-four nonmetal or semimetal atom sites; and a semiconductor compound having the general formula $$X^1_4 Yb_y A_{3x} X^2_{12-3x}$$

with a generally stoichiometric ratio of elements $X^1$ and $X^2$ which normally form a binary semiconductor compound having the skutterudite crystal lattice structure;

A selected from the group consisting of Bi, Sn, In, Ga, Ge, and Si; and y selected to be in the range of greater than zero and less than one to fill the portion of normally void subcells to optimize the thermoelectric figure of merit.

23. A thermoelectric device formed in part from at least one material having a skutterudite crystal lattice structure comprising:

multiple unit cells with each unit cell having thirty-two atomic crystallographic sites;

each unit cell having eight subcells with six of the subcells filled with planar rings of four atoms of one or more semimetal or nonmetal atoms and two subcells which normally define a respective void space within the skutterudite crystal lattice structure;

a selected portion of the normally void subcells respectively filled with a metal, semimetal or nonmetal atom;

each unit cell of the skutterudite crystal lattice having eight metal atom sites and twenty-four nonmetal or semimetal atom sites; and a semiconductor compound having the general formula $$Yb_yE_xX^1_{4-x}X^2_{12}$$

with E selected from the group consisting of Co, Rh and Ir;

$X^1$ selected from the group consisting of Sn, Ge, In, Ga and Si;

$X^2$ selected from the group consisting of Sb, P, As, Bi, Sn, In, Ga, Ge and Si, or a combination thereof; and y selected to be in the range of greater than zero and less than one to fill the selected portion of normally void subcells to optimize the thermoelectric figure of merit.

24. The thermoelectric device of claim 23 further comprising the semiconductor compound having the general formula:

$$Yb_yCo_4Sb_{12}$$

wherein y is greater than 0.05 and less than approximately 0.40.

* * * * *